(12) United States Patent
Itabashi et al.

(10) Patent No.: US 11,362,629 B2
(45) Date of Patent: Jun. 14, 2022

(54) TRANSIMPEDANCE AMPLIFIER CIRCUIT

(71) Applicant: SUMITOMO ELECTRIC INDUSTRIES, LTD., Osaka (JP)

(72) Inventors: Naoki Itabashi, Osaka (JP); Keiji Tanaka, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 17/070,723

(22) Filed: Oct. 14, 2020

(65) Prior Publication Data
US 2021/0126603 A1 Apr. 29, 2021

(30) Foreign Application Priority Data

Oct. 24, 2019 (JP) .............................. JP2019-193428

(51) Int. Cl.
*H03F 3/08* (2006.01)
*H03F 3/45* (2006.01)
*H03G 3/30* (2006.01)
*H03G 1/00* (2006.01)

(52) U.S. Cl.
CPC ........... *H03F 3/45183* (2013.01); *H03G 3/30* (2013.01); *H03F 2200/435* (2013.01); *H03G 1/0023* (2013.01); *H03G 2201/103* (2013.01)

(58) Field of Classification Search
CPC ........... H03F 3/45183; H03F 2200/435; H03F 2200/451; H03F 1/086; H03F 3/193; H03F 2203/45392; H03F 2203/45658; H03F 3/082; H03F 3/08; H03F 3/087; H03G 3/30; H03G 2201/103; H03G 1/0035; H03G 3/3084; H03G 1/0047

USPC ................. 330/59, 308; 250/214 A, 214 AG
See application file for complete search history.

(56) References Cited

U.S. PATENT DOCUMENTS

| | | | |
|---|---|---|---|
| 6,275,541 B1 | 8/2001 | Nagahori et al. | |
| 7,418,213 B2* | 8/2008 | Denoyer | H03F 1/30 398/210 |
| 7,868,701 B2* | 1/2011 | Nakamura | H03G 1/0088 330/308 |

(Continued)

FOREIGN PATENT DOCUMENTS

| JP | S57-046544 | 3/1982 |
|---|---|---|
| JP | H11-008522 | 1/1999 |

*Primary Examiner* — Khanh V Nguyen
(74) *Attorney, Agent, or Firm* — Smith, Gambrell & Russell, LLP.

(57) ABSTRACT

A transimpedance amplifier (TIA) circuit disclosed includes an input terminal, a first TIA circuit, a second TIA circuit, a field effect transistor (FET), and a gain control circuit. The first TIA circuit outputs a voltage signal from a first output in accordance with an input current received at a first input electrically connected to the input terminal. The second TIA circuit outputs a reference signal from a second output. The FET varies a resistance between a first current terminal and a second current terminal in accordance with a control signal applied to a control terminal. The first current terminal is electrically connected to the input terminal. The second current terminal is electrically connected to the second output of the second TIA circuit. The gain control circuit detects an amplitude of the voltage signal and generates the control signal according to a detection result of the amplitude.

9 Claims, 13 Drawing Sheets

(56) References Cited

U.S. PATENT DOCUMENTS

| | | | |
|---|---|---|---|
| 8,150,272 B2* | 4/2012 | Ossieur | H04B 10/6931 |
| | | | 398/202 |
| 8,405,461 B2* | 3/2013 | Moto | H03F 3/087 |
| | | | 330/308 |
| 9,577,753 B2* | 2/2017 | Sugimoto | H03F 3/08 |
| 10,608,599 B2* | 3/2020 | Sugimoto | H03G 1/0023 |
| 2010/0283542 A1 | 11/2010 | Shivaram et al. | |

* cited by examiner

TRANSIMPEDANCE AMPLIFIER CIRCUIT

CROSS REFERENCE TO RELATED APPLICATIONS

The present application claims priority based on Japanese Patent Application No. 2019-193428, which is filed on Oct. 24, 2019, the entire content disclosed in the aforementioned Japanese patent applications being incorporated herein by reference.

TECHNICAL FIELD

The present disclosure relates to a transimpedance amplifier circuit.

BACKGROUND

Japanese Unexamined Patent Publication No. H11-8522 discloses a technique relating to a digital receiving circuit. The digital receiving circuit includes a differential output amplifier circuit. Differential output signal of the differential output amplifier circuit is converted to a binary data stream by an identification circuit. The digital receiving circuit includes two peak detection circuits, an average value detection circuit, two operational amplifiers, and two transistors. Input impedance and input offset of the differential output amplifier circuit is controlled in accordance with the differential output signal of the differential output amplifier circuit.

SUMMARY

The present disclosure provides a transimpedance amplifier circuit. The transimpedance amplifier circuit include an input terminal, a first TIA circuit, a second TIA circuit, a field effect transistor (FET), and gain control circuit. The input terminal is configured to receive a current signal from an external photodetector. The first TIA circuit has a first input and a first output. The first input is electrically connected to the input terminal and is configured to receive an input current. The first TIA circuit is configured to convert the input current to an voltage signal. The first output is configure to output the voltage signal. The second TIA circuit has a second input and a second output. The second input is left open. The second output is configured to output a reference signal. The FET has a control terminal, a first current terminal, and a second current terminal. The first current terminal is electrically connected to the input terminal. The second current terminal is electrically connected to the second output of the second TIA circuit. The FET is configured to vary a resistance between the first current terminal and the second current terminal in accordance with a control signal applied to the control terminal. The gain control circuit is configured to detect an amplitude of the voltage signal and generate the control signal according to a detection result of the amplitude. The second TIA circuit has same circuit configuration that the first TIA circuit has.

BRIEF DESCRIPTION OF THE DRAWINGS

The above and other objects, features and advantages will become more apparent from the following detailed description of the preferred embodiments with reference to the accompanying drawings.

DETAILED DESCRIPTION

A transimpedance amplifier (TIA) circuit receives photocurrent generated by a photodiode. The TIA circuit converts the current (photocurrent) to a voltage. In the TIA circuit, the linearity between the input (photocurrent) and the output (voltage) is required. To maintain linearity, the TIA circuit controls amplitude of the photocurrent in an input side of the TIA circuit. Such control is an exemplary AGC (Automatic Gain Control). In particular, there are cases where an AGC circuit partially bypasses alternating current (AC) components (signal components) from the photocurrent. The present disclosure provides an effective bypassing technique.

Specific examples of a transimpedance amplifier circuit according to embodiments of the present disclosure will be described hereinafter with reference to the drawings. The present disclosure is not limited to these exemplifications. It is intended that the present invention is defined by the claims and includes all changes within the meaning and range equivalent to the claims.

Figure 1:
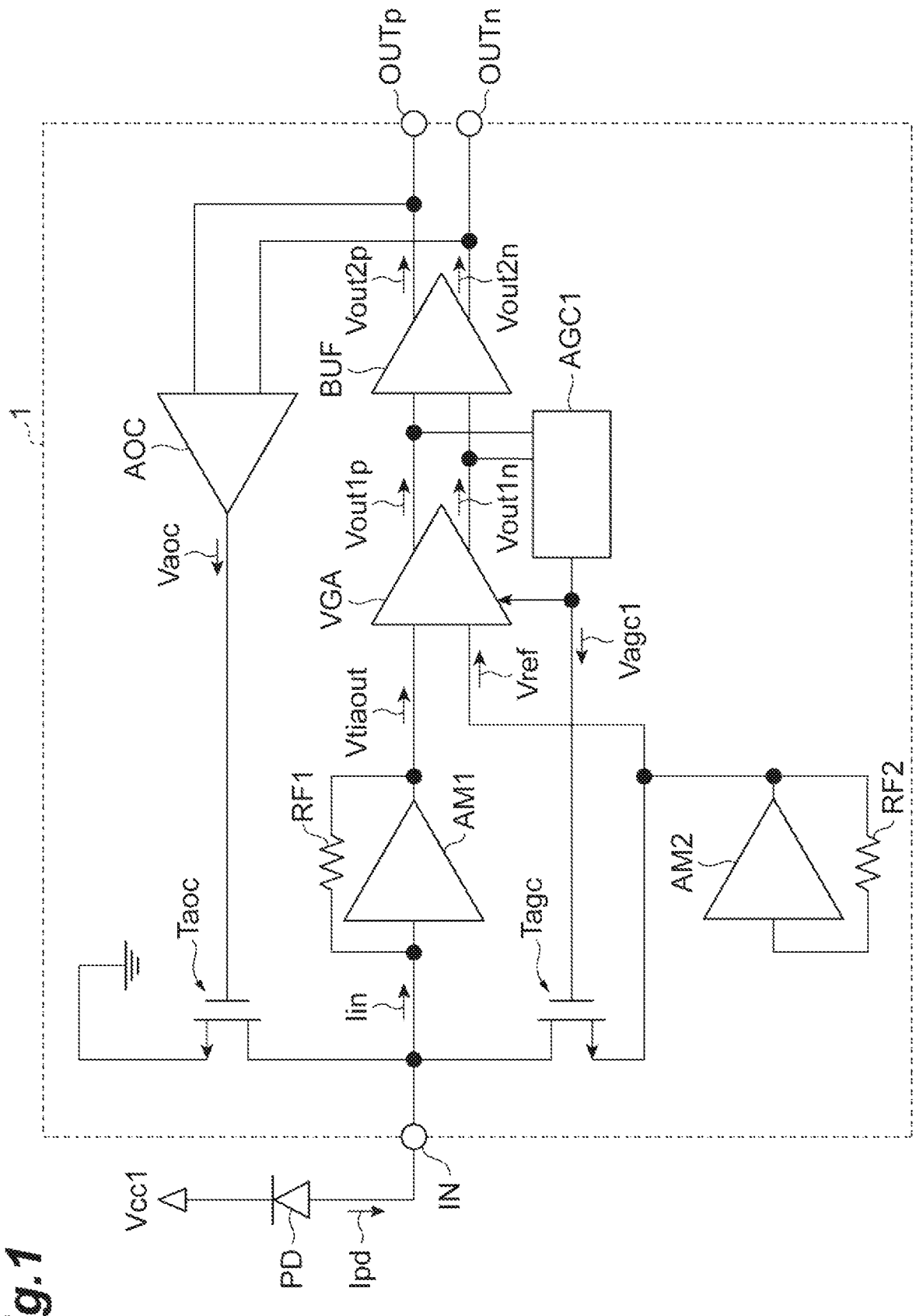
FIG. 1 is a diagram schematically showing a configuration of a transimpedance amplifier circuit according to an exemplary embodiment.

FIG. 1 is a diagram schematically showing a configuration of a transimpedance amplifier circuit according to an exemplary embodiment. The transimpedance amplifier (TIA) circuit 1 includes an input terminal IN, a first amplifier circuit AM1, a second amplifier circuit AM2, a resistor RF1 (first resistor), a resistor RF2 (second resistor), and a field effect transistor (FET) Tagc (first FET). The TIA circuit 1 further comprises a variable gain amplifier circuit VGA, an output circuit BUF, a FET Taoc, an offset control circuit AOC and a first gain control circuit AGC1. The TIA circuit 1 can be electrically connected to an external photodetector (light receiving element), for example, a photodiode PD. A current signal Ipd (photocurrent) is output from the anode of the photodiode PD. The TIA circuit 1 receives the current signal Ipd. More specifically, the input terminal IN receives the current signal Ipd from the photodiode PD.

The FET Tagc and the second amplifier circuit AM2 have a function of bypassing a portion of an alternating current (AC component) from the current signal Ipd (photocurrent). The FET Taoc and offset control circuit AOC have a function of bypassing a portion of a direct current (DC component) from the current signal Ipd.

Each of the FET Tagc and the FET Taoc can be, for example, an N-type MOS (Metal Oxide Semiconductor) FET. The FET Tagc has, for example, a gate width of about 10-20 [μm] and a gate length of about 0.05-0.2 [μm].

The first amplifier circuit AM1 is, for example, an inverting amplifier circuit. The first amplifier circuit AM1 inverts an input signal and outputs the inverted input signal as an output signal. For example, when voltage of the input signal becomes higher, voltage of the output signal becomes lower. Further, when the voltage of the input signal is lowered, the voltage of the output signal is increased. An output of the first amplifier circuit AM1 is connected to an input of the first amplifier circuit AM1 through the resistor RF1. The first amplifier circuit AM1 and the resistor RF1 constitute a main TIA (first TIA) circuit. Thus the main TIA circuit has the first amplifier circuit AM1 and the resistor RF1 (first resistor) for electrically connecting the output and the input of the first amplifier circuit AM1.

When inputting a current signal Iin to the main TIA circuit, an amplified signal is output as a voltage signal Vtiaout (TIA output signal). That is, the main TIA circuit converts the current signal Iin into the voltage signal Vtiaout. The gain of the main TIA circuit is expressed as an impedance value. The main TIA circuit has an input (first input) and an output (first output). The input receives an input current. The main TIA circuit converts the input current to a voltage signal. The output (first output) outputs the voltage signal. The input of the main TIA circuit is electrically connected to the input terminal IN.

The second amplifier circuit AM2 is, for example, an inverting amplifier circuit. The second amplifier circuit AM2 inverts an input signal and outputs the inverted input signal as an output signal. For example, when voltage of the input signal becomes higher, voltage of the output signal becomes lower. Further, when the voltage of the input signal is lowered, the voltage of the output signal is increased. An output of the second amplifier circuit AM2 is connected to an input of the second amplifier circuit AM2 through the resistor RF2 (second resistor). The second amplifier circuit AM2 and the resistor RF2 constitute a dummy TIA (second TIA) circuit. The dummy TIA circuit has an input (second input) and an output (second output), and the output is electrically connected to the input. The dummy TIA circuit has the second amplifier circuit AM2 and the resistor RF2 (second resistor) for electrically connecting the output and the input of the second amplifier circuit AM2.

The dummy TIA circuit has, for example, the same circuit configuration as the main TIA circuit. For example, the second amplifier circuit AM2 has the same circuit configuration as the first amplifier circuit AM1. Each circuit element of the first amplifier circuit AM1 has the same electrical characteristics as the corresponding circuit element of the second amplifier has. For example, the resistor RF2 has a resistance value equal to a resistance value of the resistor RF1. Incidentally, the circuit elements of the dummy TIA circuit may have different circuit constants from circuit constants which the circuit elements of the main TIA circuit has. The dummy TIA circuit has an input (second input) and an output (second output). The input is left open, and the output outputs a reference signal. Details will be described later.

When a current signal input to the dummy TIA circuit, an amplified signal is output as a voltage signal. That is, the dummy TIA circuit has a function of converting the current signal into the voltage signal. The gain of the dummy TIA circuit is represented as an impedance value. However, as shown in FIG. 1, the dummy TIA circuit has no input signal, and only the output of the second amplifier circuit AM2 through the resistor RF2 is connected to the input of the second amplifier circuit AM2. The dummy TIA circuit outputs a reference potential Vref having a constant voltage value. The reference potential Vref corresponds to the potential of the voltage signal when the current signal is set to 0 at the input of the dummy TIA circuit. The FET Tagc has a control terminal, a first current terminal, and a second current terminal. For example, the first current terminal is electrically connected to the input terminal IN, the second current terminal is electrically connected to the output of the dummy TIA circuit. The FET Tagc varies a resistance between the first current terminal and the second current terminal in accordance with a voltage applied to the control terminal. The FET Tagc bypasses a portion of the AC component of the current signals Ipd input to the input terminal IN. The part of the AC component flows from the first current terminal to the second current terminal of the FET Tagc. The magnitude of the AC component bypassed from the current signal Ipd becomes larger as the resistance value between the first current terminal and the second current terminal is reduced. The FET Tagc generates the input current Iin by subtracting the portion of the AC component of the current signal Ipd from the current signal Ipd.

The input of the first amplifier circuit AM1 is electrically connected to the input terminal IN. The Input terminal IN receives a current signal Ipd generated by the external light receiving element. The input terminal IN is electrically connected to the anode of, for example, an external photodiode PD (light receiving element). The cathode of the photodiode PD is electrically connected, for example, to a power supply Vcc1 or biasing circuit (not shown). The bias circuit provides a bias voltage to the photodiode PD. The photodiode PD generates a current signal Ipd (photocurrent) in response to a received optical signal. The input of the first amplifier circuit AM1 is electrically connected to the light receiving element through the input terminal IN. The current signal Ipd is input to the TIA circuit 1 through the input terminal IN. The current signal Ipd includes an alternating current component (AC component) and a direct current component (DC component). The AC component transmits information and the DC component corresponds to a time average of the current signal Ipd.

An input current Iin is input to the first amplifier circuit AM1. The input current is generated by subtracting a portion of the AC component from the current signal Ipd between the input terminal IN and the input of the first amplifier circuit AM1. The portion of the AC component of the current signal Ipd is shunted to the FET Tagc. Thus, subtracting the portion of the AC component from the current signal Ipd input to the input terminal Ipd by the FET Tagc is referred to as bypassing. The bypassing reduces the magnitude of the AC component input to the first amplifier circuit AM1. The DC component of the current signal Ipd can be subtracted by the field effect transistors Taoc.

The output of the second amplifier circuit AM2 and the output of the first amplifier circuit AM1 is electrically connected to the two inputs (one differential input) of the variable gain amplifier circuit VGA. The first amplifier circuit AM1 outputs a TIA output signal Vtiaout. The TIA output signal Vtiaout is input to one terminal (e.g., non-inverting input terminal) of the differential input of the variable gain amplifier circuit VGA. The second amplifier AM2 outputs the reference potential Vref. The reference potential Vref is input to another terminal (e.g., an inverting input terminal) of the differential input of the variable gain amplifier circuit VGA. The variable gain amplifier circuit VGA receives the voltage signal (TIA output signal Vtiaout) and the reference potential Vref. The variable gain amplifier circuit VGA amplifies a difference between the voltage signal Vtiaout and the reference potential Vref by a voltage gain set by a gain control voltage (gain control voltage Vagc1), and outputs the amplified voltage difference as a differential signal. The output of the dummy TIA circuit, consisting of the second amplifier circuit AM2 and the resistor RF2, supplies the reference potential Vref to the variable gain amplifier circuit VGA. Thus, the variable gain amplifier circuit VGA amplifies the difference in voltage between the two inputs (i.e., the voltage difference between the TIA output signal Vtiaout and the reference potential Vref), and outputs the amplified voltage from the two outputs (differential output). A ratio between an amplitude of the differential inputs in a denominator and an amplitude of the differential outputs in a numerator is defined as a differential gain. The differential gain can be increased or decreased depending on the gain control voltage Vagc1.

The differential output of the variable gain amplifier circuit VGA is electrically connected to two inputs (one differential input) of the output circuit BUF. The differential input of the output circuit BUF receives the output signal Vout1p and the output signal Vout1n output from the differential output of the variable gain amplifier circuit VGA, for example. The output signal Vout1p and the output signal Vout1n correspond to a pair of complementary signals inverted in phase with each other (one differential output signal). Two outputs of the output circuit BUF (one differential output) is electrically connected, for example, to the output terminal OUTp and the output terminal OUTn of the TIA circuit 1. The differential output of the output circuit BUF outputs an output signal Vout2p and the output signal Vout2n. The output signal Vout2p and the output signal Vout2n correspond to a pair of complementary signals inverted in phase with each other (one differential output signal). For example, when one of the complementary signals increases, the other of the complementary signals decreases, and when the one of the complementary signals decreases, the other of the complementary signals increases. When the one of the complementary signals reaches a maximum value (peak value), the other of the complementary signals reaches a minimum value (bottom value), and when the one of the complementary signals reaches a bottom value, the other of the complementary signals reaches a peak value. In general, it is preferable that the one of the complementary signals has an amplitude identical to an amplitude of the other of the complementary signals, and has a time average identical to a time average of the other of the complementary signals.

The input of the first amplifier circuit AM1 is electrically connected to the output of the second amplifier circuit AM2 through the FET Tagc. For example, the drain (first current terminal) of the FET Tagc is electrically connected to the input of the first amplifier circuit AM1. For example, the source (second current terminal) of the FET Tagc is electrically connected to the output of the second amplifier circuit AM2. The gate (control terminal) of the FET Tagc is electrically connected to the first gain control circuit AGC1.

Changing a voltage (gate voltage) applied to the gate of the FET Tagc increases or decreases the resistance (on-resistance) between the drain and the source of the FET Tagc. For example, the gate voltage of the FET Tagc is set higher than a threshold voltage with reference to the voltage of the source (source voltage), the on-resistance decreases when the gate voltage is increased, the on-resistance increases when the gate voltage is decreased. By increasing or decreasing the on-resistance value, the current amount (subtracted amount) bypassed by the FET Tagc from the current signal Ipd decreases or increases. For example, increasing the gate voltage of the FET Tagc increases the subtracted amount. Decreasing the gate voltage decreases the subtracted amount. Incidentally, voltage of the drain (first current terminal) is preferably equal to voltage of the source (second current terminal). When the drain (the first current terminal) and the source (the second current terminal) has the same voltage, the AC component of the current signal Ipd can be partially bypassed through the FET Tagc, although the DC component of the current signal Ipd hardly flows from the drain (the first current terminal) to the source (the second current terminal). The FET Tagc preferably operates in the linear region (non-saturation region) of the drain-current voltage characteristic.

The first amplifier circuit AM1 includes, for example, an emitter follower circuit. The output of the first amplifier circuit AM1 is output from, for example, the emitter follower of the first amplifier circuit AM1 (see FIG. 5). The second amplifier circuit AM2 includes, for example, an emitter follower circuit. The output of the second amplifier circuit AM2 is output from, for example, the emitter follower of the second amplifier circuit AM2.

The offset control circuit AOC has two inputs (one differential input) electrically connected, for example, to the differential output of the output circuit BUF. The offset control circuit AOC has an output electrically connected to the gate of the FET Taoc. The differential input of the offset control circuit AOC receives a differential output signal Vout2p, Vout2n from the differential output of the output circuit BUF, for example. The offset control circuit AOC detects an offset of the output signal Vout2p and the output signal Vout2n, and, based at least in part on the detection result, generates an offset control voltage Vaoc and outputs it to the gate of the FET Taoc. The offset of the output signal Vout2p and the output signal Vout2n corresponds to a difference in voltage between a DC component (time average) of the output signal Vout2p and a DC component (time average) of the output signal Vout2n. By varying the offset control voltage Vaoc, the DC component of the current signals Ipd bypassed by the FET Taoc increases or decreases.

The input of the first amplifier circuit AM1 is electrically connected to ground (ground potential) through the FET Taoc. That is, the source of the FET Taoc is grounded. The drain of the FET Taoc is electrically connected to the input of the input terminal IN and the first amplifier AM1. The FET Taoc operates in a saturation region of the drain-current voltage characteristic thereof, when a difference between voltage of the drain (drain voltage) and voltage of the source (source voltage) (drain-source voltage) is larger than a predetermined value. At that time, the FET Taoc operates as a variable current source. For example, when the offset control voltage Vaoc inputted to the gate of the FET Taoc is set higher than the threshold voltage with the source voltage as a reference, increasing the offset control voltage Vaoc increases the DC component bypassed by the FET Taoc from the current signal Ipd. Conversely, decreasing the offset control voltage Vaoc decreases the DC component bypassed by the FET Taoc from the current signal Ipd. Incidentally, The FET Taoc operating in the saturated region of the drain-current voltage characteristic allows impedance between the drain and the source thereof to be much larger than the on-resistance of the FET Tagc. Therefore, the FET Taoc can partially bypass the DC component of the current signal Ipd to ground, although the AC component of the current signal Ipd hardly flows from the drain to the source thereof.

The first gain control circuit AGC1 is electrically connected to the differential output of the variable gain amplifier circuit VGA. For example, the first gain control circuit AGC1 receives a differential output signal Vout1$p$, Vout1$n$ from the differential output of the variable gain amplifier circuit VGA. The first gain control circuit AGC1 detects voltage amplitude of the differential output signal Vout1$p$, Vout1$n$. Based at least in part on the detection result, the first gain control circuit AGC1 generates a gain control voltage Vagc1 and outputs it to the variable gain amplifier circuit VGA and the gate (control terminal) of the FET Tagc.

The variable gain amplifier circuit VGA is electrically connected to the first amplifier circuit AM1, the second amplifier circuit AM2, and the output circuit BUF. The variable gain amplifier circuit VGA receives the TIA output signal Vtiaout from the first amplifier circuit AM1 at one of the two inputs. The variable gain amplifier circuit VGA receives the reference potential Vref from the second amplifier circuit AM2 at the other of the two inputs.

The variable gain amplifier circuit VGA changes the differential gain in accordance with the gain control voltage Vagc1 outputted from the first gain control circuit AGC1. The variable gain amplifier circuit VGA amplifies a difference in voltage (voltage difference) between the TIA output signal Vtiaout and the reference potential Vref by the differential gain, and outputs the amplified voltage difference as a differential output signal Vout1$p$, Vout1$n$. For example, when the differential gain is assumed as Avga, the relation between voltage amplitude of the differential input Vtiaout-Vref and voltage amplitude of the differential output Vout1$p$-Vout1$n$ is expressed as (Vout1$p$-Vout1$n$)=Avga×(Vtiaout-Vref). For example, the variable gain amplifier circuit VGA controls the differential gain Avga of the variable gain amplifier circuit VGA reversely with respect to the gain control voltage Vagc1. More specifically, the variable gain amplifier circuit VGA decreases the differential gain Avga, when the gain control voltage Vagc1 increases.

Increasing of the current signal Ipd increases the amplitude of the output signal Vout1$p$, Vout1$n$. To prevent the amplitude of the output signal Vout1$p$, Vout1$n$ from being saturated, the first gain control circuit AGC1 increases the bypassed amount of the AC component from the current signal Ipd through the FET Tagc and/or decreases the gain of the variable gain amplifier circuit VGA. That is, when the current signal Ipd approaches a certain value, the first gain control circuit AGC1 starts to increase the gain control voltage Vagc1 for increasing the bypassed amount of the AC current from the current signal Ipd through the FET Tagc and decreasing the gain Avga of the variable gain amplifier circuit VGA. Incidentally, after the bypassed amount of the AC component is increased and the gain Avga is decreased against the increasing of the current signal Ipd, the first gain control circuit AGC1 decreases the bypassed amount of the AC component and increases the gain Avga against decreasing of the current signal Ipd.

Incidentally, when the amplitude of the AC component of the current signal Ipd exceeds a certain value, the amplitude of the TIA output signal Vtiaout of the first amplifier circuit AM1 becomes saturated (limited) without increasing. Further, when the difference between the TIA output signal Vtiaout and the reference potential Vref exceeds a certain value, the amplitude of the differential output signal Vout1$p$, Vout1$n$ is saturated without increasing. Generally, when an output signal of the amplifier is saturated, linearity of the output signal relative to an input signal is impaired. The AC component bypassed through the FET Tagc by varying the gain control voltage Vagc1 is preferably controlled so that the TIA output signal Vtiaout of the first amplifier circuit AM1 is not saturated. For example, so that the first amplifier circuit AM1 performs a linear amplifying operation, it is preferable that the bypassed amount of the AC component through the FET Tagc is controlled. The gain Avga of the variable gain amplifier circuit VGA by the gain control voltage Vagc1 is preferably controlled so that the differential output signal Vout1$p$, Vout1$n$ of the variable gain amplifier circuit VGA is not saturated. For example, so that the variable gain amplifier circuit VGA performs a linear amplifying operation, it is preferable that the gain Avga is controlled. Either the control of the bypassed amount of the AC component or the control of the gain Avga may be performed first, or both may be performed simultaneously.

Figure 2:
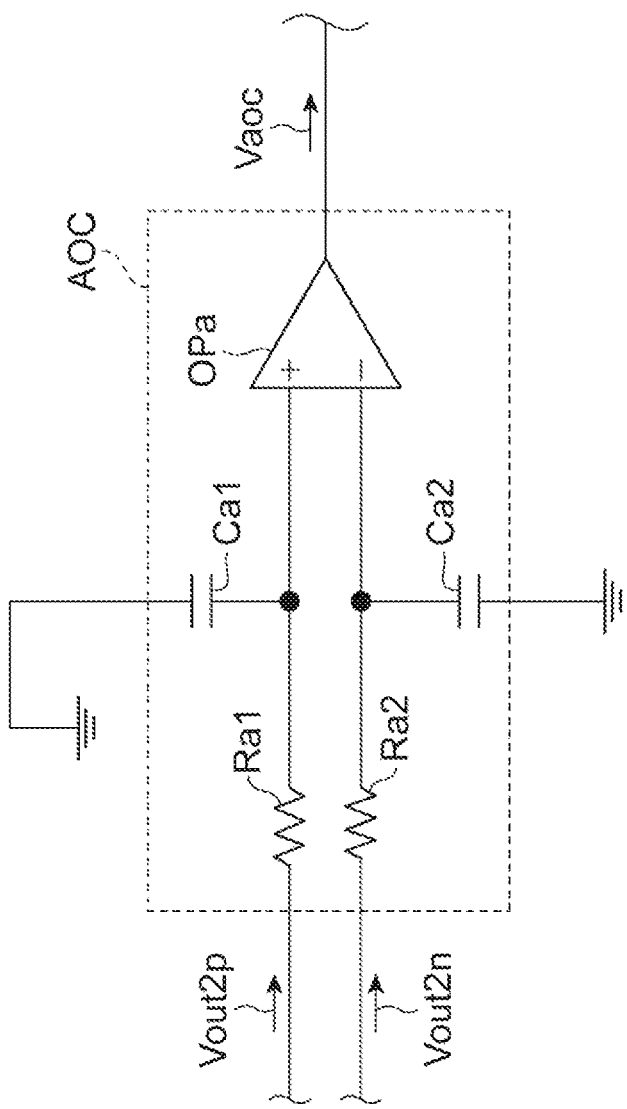
FIG. 2 is a diagram showing an example of a specific configuration of an offset control circuit shown in FIG. 1.

Referring to FIG. 2, configuration of the offset control circuit AOC will be described. The offset control circuit AOC includes, for example, a resistor Ra1 (resistive element), a resistor Ra2 (resistive element), a capacitor Ca1 (capacitive element), a capacitor Ca2 (capacitive element), an operational amplifier OPa. The resistor Ra1 and the resistor Ra2 are electrically connected in series to a differential input of the operational amplifier OPa. For example, a non-inverting input terminal of the operational amplifier OPa receives a positive-phase component of a differential signal through the resistor Ra1, an inverting input terminal of the operational amplifier OPa receives a negative-phase component of the differential signal through the resistor Ra2.

The differential input of the operational amplifier OPa (non-inverting input terminal and the inverting input terminal) receives the output signal Vout2$p$ and the output signal Vout2$n$ through the resistor Ra1 and the resistor Ra2, respectively. The differential input of the operational amplifiers OPa is grounded through capacitors Ca1 and Ca2. The resistor Ra1 and the capacitor Ca1, the resistor Ra2 and the capacitor Ca2 constitute a low-pass filter, respectively. Thus, a DC component of the output signal Vout2$p$ (time-averaged value of the voltage, referred to as DC potential) is input to the non-inverting input terminal of the operational amplifier OPa, and a DC component of the output signal Vout2$n$ (DC potential) is input to the inverting input terminal of the operational amplifier OPa. The offset control circuit AOC outputs a signal corresponding to the difference (offset voltage) between the DC potential of the positive-phase component Vout2$p$ and the DC potential of the negative-phase component Vout2$n$ of the differential signal Vout2$p$, Vout2$n$ as offset control voltage Vaoc. In general, it is preferable that the DC potential of the positive phase component and the DC potential of the negative phase component of the differential signal are balanced. That is, the offset voltage is preferably zero, or its absolute value should be reduced as small as possible. It is referred to as offset control to reduce the difference between the DC potential of the positive phase component and the DC potential of the negative phase component of a differential signal. From the output of the operational amplifier OPa, the offset control voltage Vaoc for a offset control of the differential output Vout2p, Vout2n of the output circuit BUF is output.

Figure 3:
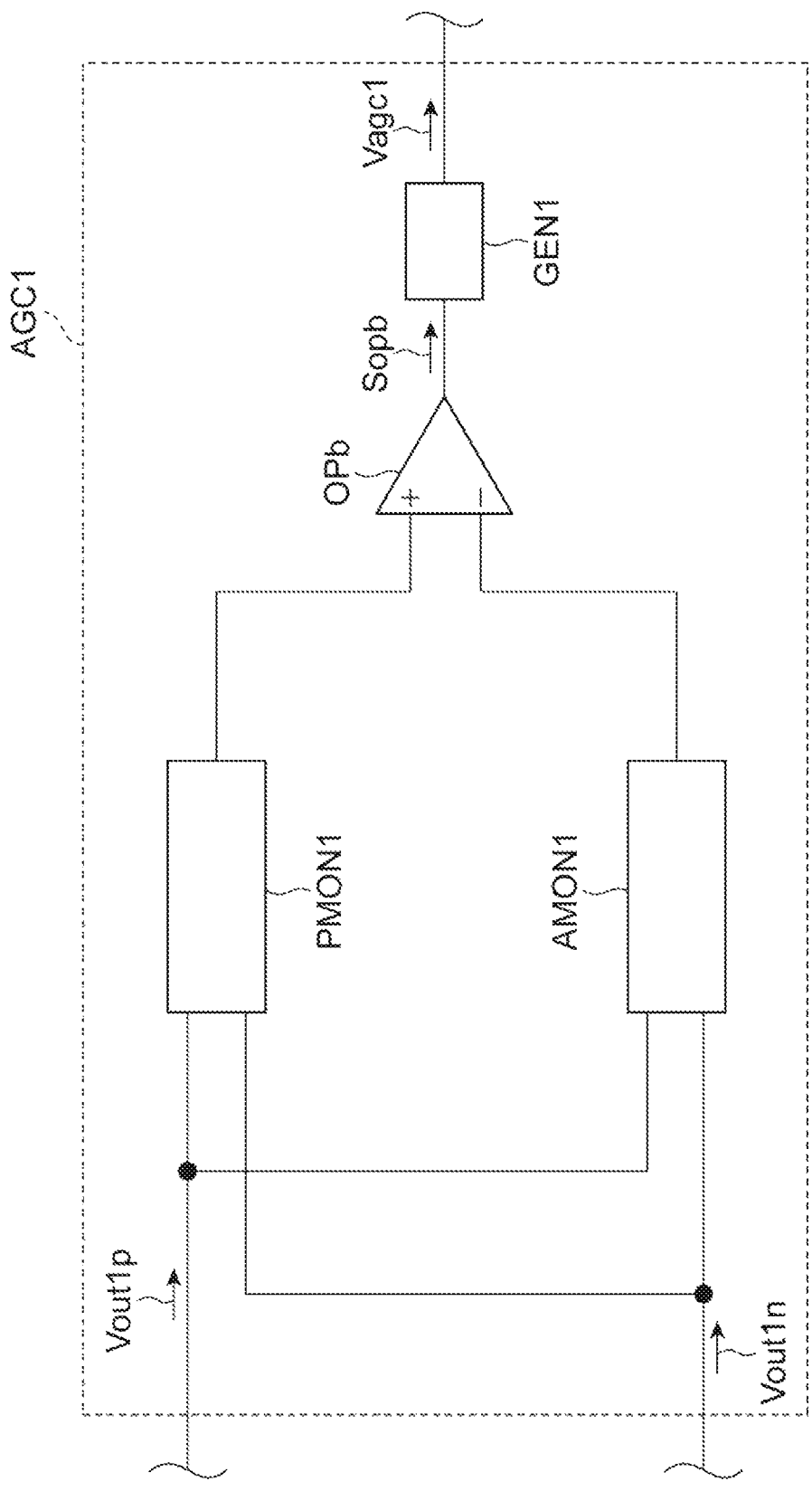
FIG. 3 is a diagram showing an example of a specific configuration of a first gain control circuit shown in FIG. 1.

Referring to FIG. 3, a configuration of the first gain control circuit AGC1 is described. The first gain control circuit AGC1 includes, for example, a peak detection circuit PMON1, an average value detection circuit AMON1, an operational amplifier OPb, and a control voltage generating circuit GEN1.

The output signal Vout1p input to the first gain control circuit AGC1 is input to the peak detection circuit PMON1 and the average value detection circuit AMON1. The output signal Vout1n input to the first gain control circuit AGC1 is input to the peak detection circuit PMON1 and the average value detection circuit AMON1.

A signal output from the average value detection circuit AMON1 and a signal output from the peak detection circuit PMON1 are input to a differential input of the operational amplifier OPb. The control voltage generating circuit GEN1 receives an output signal Sopb output from the operational amplifier OPb, and outputs the gain control voltage Vagc1.

The peak detection circuit PMON1 detects a peak value of the differential output signal Vout1p, Vout1n. The peak detection circuit PMON1 outputs a signal indicating a detection result of the peak value to, for example, one of the differential input of the operational amplifier OPb (e.g., non-inverting input terminal).

The average value detection circuit AMON1 detects an average value of the differential output signal Vout1p, Vout1n. The average value detection circuit AMON1 outputs a signal indicating the detection result of the average value to, for example, the other of the differential input of the operational amplifier OPb (e.g., inverting input terminal). Incidentally, for example, when exchanging the non-inverting input terminal and the inverting input terminal of the operational amplifier OPb to each other, logic of the output signal Sopb is inverted with respect to prior to exchanging (increase or decrease of the output signal with respect to increase or decrease of the input signal is reversed). However, if the control voltage generating circuit GEN1 has an inversion function in that case, the gain control voltage Vagc1 practically becomes unchanged prior to the exchanging. Therefore, another configuration where the output of the peak detection circuit PMON1 is connected to the inverting input terminal of the operational amplifier OPb and the output of the average value detection circuit AMON1 is connected to the non-inverting input terminal of the operational amplifier OPb can also be considered. Such exchanging of input terminals of a differential input can be applied to other operational amplifiers described later.

The operational amplifier OPb, based at least in part on the signal output from the peak detection circuit PMON1 (signal indicating the peak value) and the signal output from the average value detection circuit AMON1 (signal indicating the average value), outputs the output signal Sopb to the control voltage generating circuit GEN1. The output signal Sopb indicates, for example, an amplitude of the differential output signal Vout1p, Vout1n output from the variable gain amplifier circuit VGA. More specifically, subtracting an average value of a signal from a peak value of the signal makes a crest value (half value of a peak-to-peak value). As the crest value corresponds to one half of the amplitude of the signal, therefore, detecting the crest value enables detection of the amplitude of the signal.

For example, in a case that, against increasing of the current signal Ipd, the AC component of the current signal Ipd is not bypassed by the FET Tagc described above and the gain Avga of the variable gain amplifier circuit VGA is not decreased, the output signal Sopb has a voltage corresponding to the magnitude of the current signal Ipd output from the anode of the photodiode PD. For example, when the magnitude of the AC component of the current signal Ipd is increased, the voltage of the output signal Sopb is increased. Further, when the bypassed amount of the AC component through the FET Tagc and the gain Avga of the variable gain amplifier circuit VGA are maintained at a constant value, respectively, the output signal Sopb is varied in accordance with the magnitude of the current signal Ipd output from the anode of the photodiode PD.

The control voltage generating circuit GEN1 of the first gain control circuit AGC1 receives the output signal Sopb, and outputs a gain control voltage Vagc1 to the gate of the FET Tagc.

The circuit configuration of the control voltage generating circuit GEN1 is described with reference to FIG. 4. The control voltage generating circuit GEN1 receives the output signal Sopb corresponding to the amplitude of the differential output signal from the variable gain amplifier circuit VGA (output signal Vout1p and output signal Vout1n), and controls the gain of the variable gain amplifier circuit VGA and the bypassed amount of the AC component of the current signal Ipd through the FET Tagc.

The control voltage generating circuit GEN1 is electrically connected to the variable gain amplifier circuit VGA to control the gain of the variable gain amplifier circuit VGA. The control voltage generator GEN1 is electrically connected to the gate of the FET Tagc to control the bypassed amount of the AC component from the current signal Ipd through the FET Tagc.

The control voltage generating circuit GEN1 includes, for example, a FET Td1 (second FET), a FET Td2 (third FET), a FET Td3 (fourth FET), a FET Td4 (fifth FET), and a FET Td5 (sixth FET).

The control voltage generating circuit GEN1, for example, includes a resistor Rd1 (fifth resistor), a resistor Rd2 (sixth resistor), and a resistor Rd3 (seventh resistor), further a current source CS.

Each of the FET Td1 and the FET Td2 may be, for example, an N-type MOS transistor. The FET Td1 and the FET Td2 preferably have the same electrical properties as a pair of differential pair transistors.

Each of the FET Td3, the FET Td4, and the FET Td5 can be, for example, a P-type MOS transistor. The FET Td4 and the FET Td5 preferably have the same electrical properties as a pair of loading elements.

A static potential Vst is input to the gate of the FET Td1. The static potential Vst may be provided externally from the control voltage generating circuit GEN1 or generated within the control voltage generating circuit GEN1. The source of the FET Td1 is electrically connected to the current source CS through a resistor Rd1. The gate of the FET Td2 receives the output signal Sopb output from the operational amplifier OPb of the first gain control circuit AGC1.

The source of the FET Td2 is electrically connected to the current source CS through a resistor Rd2. The resistor Rd1 and the resistor Rd2 are set to, for example, the same resistance value.

The drain of the FET Td3 is grounded through a resistor Rd3. The FET Td3 and the resistor Rd3 constitute an inverting circuit where the gate of the FET Td3 is an input and the drain of the FET Td3 is an output. The output of the inverting circuit is electrically connected to the variable gain amplifier circuit VGA and the gate of the FET Tagc.

The drain of the FET Td3 outputs the gain control voltage Vagc1 to the variable gain amplifier circuit VGA and the gate of the FET Tagc.

The gate of the FET Td4 is electrically connected to the drain of the FET Td4. The gate of the FET Td5 is electrically connected to the drain of the FET Td5. The respective drains of the FET Td1 and the FET Td4 are electrically connected to each other.

The drain of the FET Td2, the drain of the FET Td5, and the gate of the FET Td3 are electrically connected to each other. The respective sources of the FET Td3, the FET Td4, and the FET Td5 are electrically connected to a power supply Vcc3 through a power line. The power supply Vcc3 supplies a power supply voltage VCC3 for circuit operation.

In the control voltage generating circuit GEN1, when voltage of the output signal Sopb is greater than the static potential Vst, a source current supplied by the current source CS flows more into the FET Td2 than the FET Td1, so that the drain potential of the FET Td2 is decreased (approaches the ground potential). The power supply voltage VCC3 provides a reference potential to the control voltage generating circuit GEN1. When the drain potential of the FET Td2 is smaller than a threshold voltage of the FET Td3 (at this time, the absolute value of the gate-source voltage of the FET Td3 is increased), the gain control voltage Vagc1 generated by the drain current of the FET Td3 flowing through the resistor Rd3 is increased. The reference potential of the gain control voltage Vagc1 is ground. Further, when the voltage of the output signal Sopb is smaller than the static potential Vst, the source current supplied by the current source CS flows more into the FET Td1 than the FET Td2, so that the drain potential of the FET Td2 is increased (approaches the power supply voltage VCC3). When the drain potential of the FET Td2 becomes larger than the threshold voltage of the FET Td3 (the absolute value of the gate-source voltage of the FET Td3 is decreased), for example, the drain current of the FET Td3 is cut off and the gain control voltage Vagc1 becomes small (a value close to 0V). Therefore, by varying the static potential Vst, it is possible to adjust a voltage for starting to increase the gain control voltage Vagc1 with respect to the detection result (output signal Sopb) of the amplitude of the differential output signal Vout1p, Vout1n output from the variable gain amplifier circuit VGA.

Figure 5:
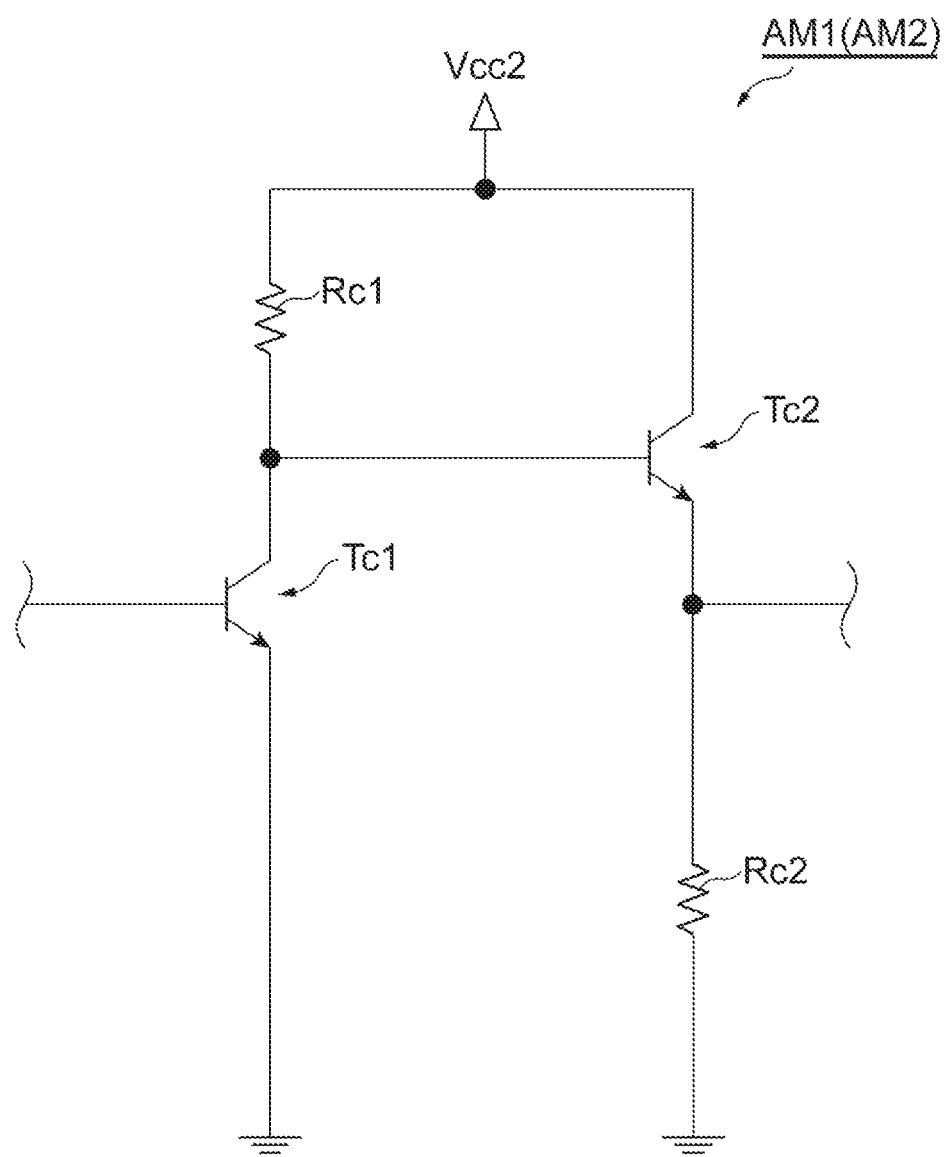
FIG. 5 is a diagram showing an example of a specific configuration of a first amplifier circuit shown in FIG. 1.

Referring to FIG. 5, circuit configuration of the first amplifier circuit AM1 is described. The circuit configuration of the second amplifier circuit AM2 is omitted, because the second amplifier circuit AM2 has the same circuit configuration as the first amplifier circuit AM1.

The first amplifier circuit AM1 includes, for example, a transistor Tc1 (first transistor) and the transistor Tc2 (second transistor), a resistor Rc1 (third resistor) and a resistor Rc2 (fourth resistor). The transistor Tc1 and the resistor element Rc1 constitute an inverting amplifier circuit. The transistor Tc2 and the resistor element Rc2 constitute an emitter follower circuit (first emitter follower). Thus, the first amplifier circuit AM1 includes the inverting amplifier and the emitter follower. The inverting amplifier includes the transistor Tc1 and the resistor Rc1. The emitter follower include the transistor Tc2 and the resistor Rc2. The output of the inverting amplifier circuit is output from the output of the first amplifier circuit AM1 through the emitter follower circuit.

The base of the transistor Tc1 (control terminal) is electrically connected to an input of the first amplifier circuit AM1. The emitter of the transistor Tc2 (first current terminal) is electrically connected to an output of the first amplifier circuit AM1. The collector of the transistor Tc1 (second current terminal) is an output of the inverting amplifier circuit constituted by the transistor Tc1 and the resistor Rc1 (third resistor element). The base (control terminal) of the transistor Tc2 is an input of the emitter follower constituted by the transistor Tc2 and the resistor Rc2. The collector of the transistor Tc1 (second current terminal) is electrically connected to the base of the transistor Tc2.

The collector of the transistor Tc1 is electrically connected to the power supply Vcc2 through the resistor Rc1. Instead of the power supply Vcc2, the collector of the transistor Tc may be connected to the power supply line electrically connected to the power supply Vcc2. The collector of the transistor Tc2 is electrically connected to the power supply Vcc2. The emitter of the transistor Tc1 is grounded. The emitter of the transistor Tc2 is grounded through the resistor Rc2. The emitter of the transistor Tc2 is the output of the emitter follower of the first amplifier circuit AM1 and has a relatively low-impedance. For example, the output impedance of the emitter follower consisting of the transistor Tc2 and the resistor element Rc2 is smaller than the output impedance of the inverting amplifier circuit constituted by the transistor Tc1 and the resistor element Rc1 (third resistor element).

Power supply lines electrically connected to the power supply Vcc2 or power supply Vcc2 provide a power supply voltage VCC2 to the transistor Tc1 and transistor Tc2.

Each of the transistor Tc1 and the transistor Tc2 can be, for example, an NPN-type bipolar transistor. When the voltage applied to the base (control terminal) of the transistor Tc1 is increased and the collector current flows through the transistor Tc1, the voltage drop generated by the collector current flowing through the resistor element Rc1 causes the voltage (collector voltage) of the collector of the transistor Tc1 to decrease. The collector voltage of the transistor Tc1 is shifted to a low potential side by the emitter follower constituted by the transistor Tc2 and the resistor Rc2, and is output from the emitter of the transistor Tc2. Therefore, when the input voltage of the first amplifier circuit AM1 is increased, the output voltage of the first amplifier circuit AM1 is decreased.

Incidentally, although the second amplifier circuit AM2 has the same circuit configuration as the circuit configuration of the first amplifier circuit AM1, it may change the circuit constants of the circuit elements corresponding to each other. For example, when a coefficient is assumed as A (A is a positive real number), the resistance value of the resistor Rc1 of the second amplifier circuit AM2 can be set to a product of the coefficient A and the resistance value of the resistance element Rc1 of the first amplifier circuit ANIL The resistance value of the resistance element Rc2 of the second amplifier circuit AM2 can be set to a product of the coefficient A and the resistance value of the resistance element Rc2 of the first amplifier circuit ANIL At the same time, the size of the transistor Tc1 of the second amplifier circuit AM2 (e.g., emitter area) can be set to a product of the inverse number 1/A and the size of the transistor Tc1 of the first amplifier circuit AM1 (e.g., emitter area). The size of the transistor Tc2 of the second amplifier circuit AM2 (e.g., emitter area) can be set to a product of the inverse number 1/A and the size of the transistor Tc2 of the first amplifier circuit AM1 (e.g., emitter area). In this manner, the second amplifier circuit AM2 may be scaled by the coefficient A with respect to the first amplifier circuit AM1. Such scaling allows voltage value of the reference potential Vref output by the second amplifier circuit AM2 (dummy TIA circuit) to be unchanged. For example, when the coefficient A is set to a value greater than 1, the power supply current flowing through the second amplifier circuit AM2 by scaling becomes 1/A times of the the power supply current before scaling. The scaling allows the power dissipation of the dummy TIA circuit to be reduced. Incidentally, when scaling the dummy TIA circuit with respect to the main TIA circuit, in addition to scaling with respect to the first amplifier circuit AM1 of the second amplifier circuit AM2 described above, the resistance value of the resistor element RF2 is set to a product of the coefficient A and the resistance value of the resistor element RF1.

Modification 1

In the TIA circuit 1 shown in FIG. 1, the first gain control circuit AGC1 provides a control signal (gain control voltage Vagc1) to both of the FET Tagc and the variable gain amplifier circuit VGA. However, in the TIA circuit 1A shown in FIG. 6, a control signal for the FET Tagc and a control signal for the variable gain amplifier circuit VGA are separately provided from different circuits. Hereinafter, different parts of the configuration of the TIA circuit 1A shown in FIG. 6 from the configuration of the TIA circuit 1 shown in FIG. 1 are described.

Figure 6:
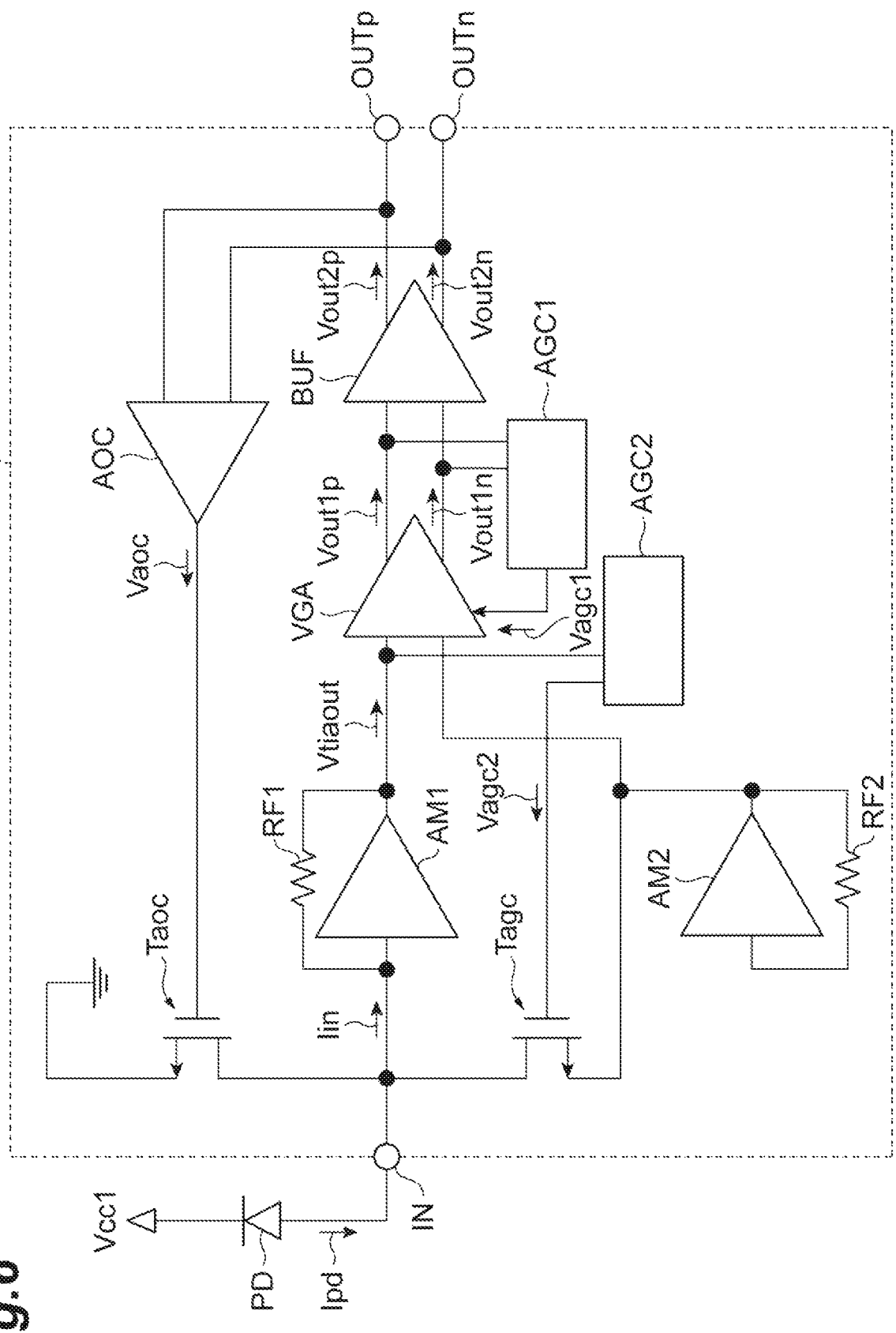
FIG. 6 is a diagram showing another configuration of the transimpedance amplifier circuit according to the exemplary embodiment.

The TIA circuit 1A shown in FIG. 6 includes the first gain control circuit AGC1 and a second gain control circuit AGC2. The first gain control circuit AGC1 provides the gain control voltage Vagc1 to the variable gain amplifier circuit VGA. The second gain control circuit AGC2 provides the gain control voltage Vagc2 to the gate of the FET Tagc.

The peak detection circuit PMON1 and the average value detection circuit AMON1 of the first gain control circuit AGC1 are electrically connected to the differential output of the variable gain amplifier circuit VGA. The control voltage generating circuit GEN1 of the first gain control circuit AGC1 is electrically connected to the variable gain amplifier circuit VGA, not connected to the FET Tagc (see FIG. 6).

The first gain control circuit AGC1 receives the differential output signal Vout1$p$, Vout1$n$ of the variable gain amplifier circuit VGA. The first gain control circuit AGC1 generates a gain control voltage Vagc1 based at least in part on the differential output signal Vout1$p$, Vout1$n$. More particularly, the first gain control circuit AGC1 detects the amplitude of the differential output signal Vout1$p$, Vout1$n$, and generates a gain control voltage Vagc1 in accordance with the detection result. For example, when the amplitude of the differential output signal Vout1$p$, Vout1$n$ becomes greater than a predetermined value, the first gain control circuit AGC1 varies the gain control voltage Vagc1 so that the gain Avga of the variable gain amplifier circuit VGA is decreased.

Figure 4:
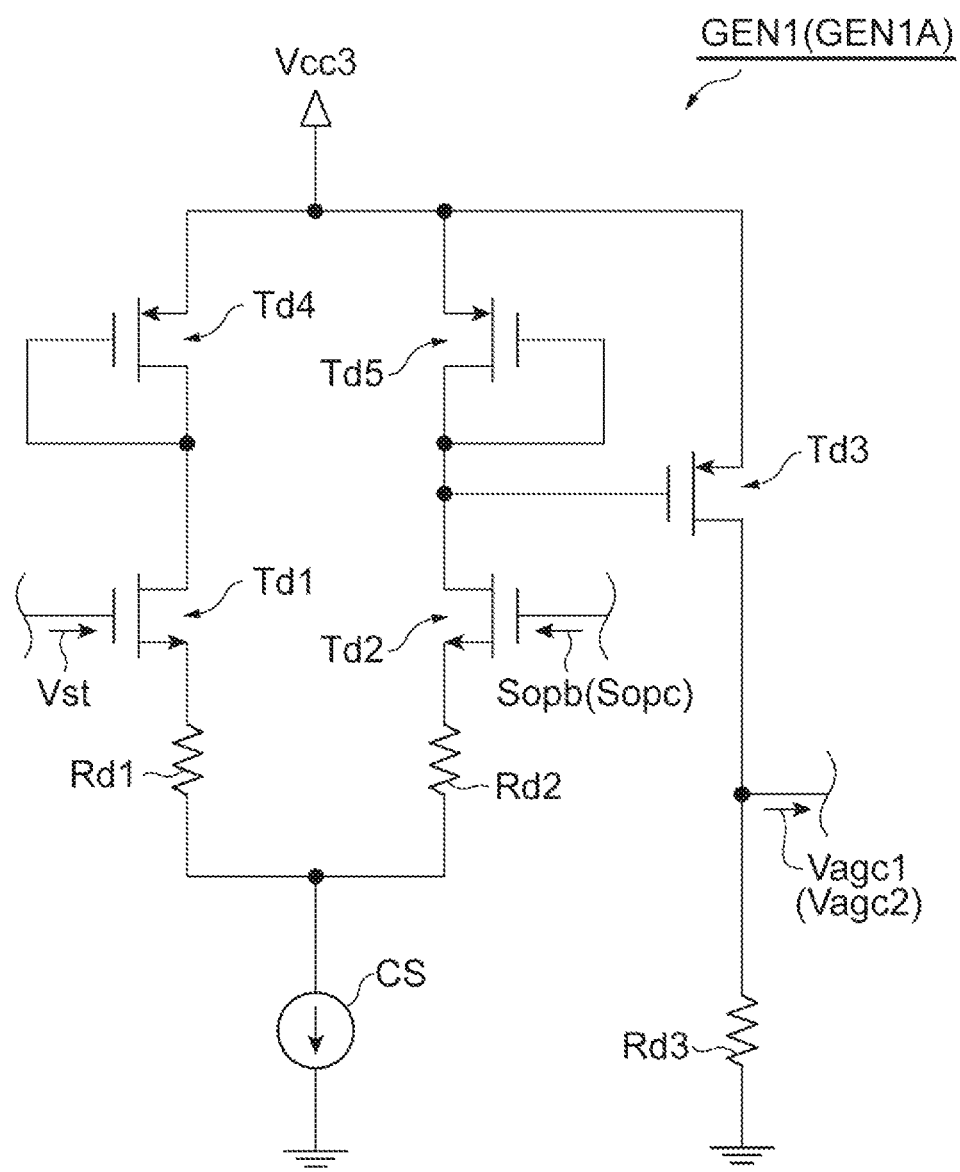
FIG. 4 is a diagram showing an example of a specific configuration of a control voltage generating circuit shown in FIG. 3.

The gain control voltage Vagc1 output from the first gain control circuit AGC1, for example, is output from the drain of the FET Td3 of the control voltage generating circuit GEN1 in the first gain control circuit AGC1 (see FIG. 4).

The second gain control circuit AGC2 is provided between the output of the first amplifier circuit AM1 and the gate of the FET Tagc. For example, the second gain control circuit AGC2 is electrically connected to the output of the first amplifier circuit AM1 and the gate of the FET Tagc.

The second gain control circuit AGC2 detects the amplitude of the voltage signal output from the main TIA circuit (the first amplifier circuit AM1 in which the input and the output are electrically connected through the resistor RF1) and controls a voltage applied to the control terminal of the FET Tagc in accordance with the detection result. The second gain control circuit AGC2 adjusts the voltage applied to the control terminals of the FET Tagc to increase a portion of the AC component of the current signal Ipd that is bypassed through the FET Tagc, when the amplitude of the voltage signal increases beyond a predetermined value.

The second gain control circuit AGC2 receives the TIA output signal Vtiaout from the output of the main TIA circuit. The second gain control circuit AGC2 generates the gain control voltage Vagc2 based at least in part on the TIA output signal Vtiaout. More specifically, the second gain control circuit AGC2 detects the amplitude of the TIA output signal Vtiaout and generates the gain control voltage Vagc2 in response to the detection result. For example, when the amplitude of the TIA output signal Vtiaout becomes greater than a predetermined value, the second gain control circuit AGC2 varies the gain control voltage Vagc2 so that the bypassed amount of the AC component through the FET Tagc is increased.

Figure 7:
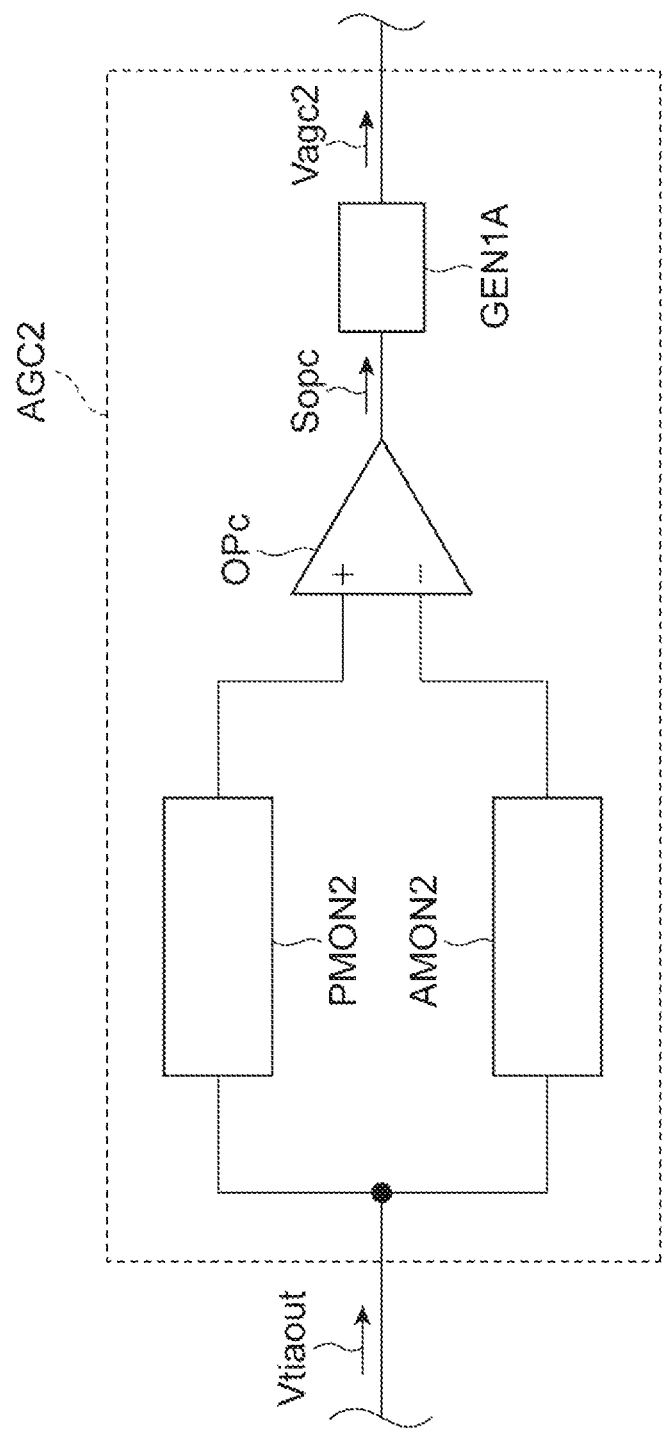
FIG. 7 is a diagram showing an example of a specific configuration of a second gain control circuit shown in FIG. 6.

Referring to FIG. 7, configuration of the second gain control circuit AGC2 is described. The second gain control circuit AGC2 includes, for example, a peak detection circuit PMON2, an average value detection circuit AMON2, an operational amplifier OPc, a control voltage generating circuit GEN1A.

The peak detecting circuit PMON2 and the average value detection circuit AMON2 of the second gain control circuit AGC2 are electrically connected to the output of the main TIA circuit. The control voltage generating circuit GEN1A of the second gain control circuit AGC2 is electrically connected to the gate of the FET Tagc, not connected to the variable gain amplifier circuit VGA.

The TIA output signal Vtiaout input to the second gain control circuit AGC2 is input to the peak detection circuit PMON2 and the average value detection circuit AMON2. Signals output from the peak detection circuit PMON2 and the average value detection circuit AMON2 are input to a differential input of the operational amplifier OPc and amplified by the operational amplifier OPc. The amplified signal is output from the operational amplifier OPc, as output signal Sopc. For example, the signal output from the peak detection circuit PMON2 is input to the non-inverting input terminal of the operational amplifier OPc. The signal output from the average value detection circuit AMON2 is input to the inverting input terminal of the operational amplifier OPc. The non-inverting input terminal and the inverting input terminal constitute the differential input of the operational amplifier OPc.

The output signal Sopc is input to the control voltage generating circuit GEN1A. The control voltage generating circuit GEN1A generates the gain control voltage Vagc2 in accordance with the output signal Sopc and outputs it from the control voltage generating circuit GEN1A.

The peak detection circuit PMON2 detects a peak value of the TIA output signal Vtiaout. The peak detection circuit PMON2 outputs a signal indicating the detection result of the peak value to one of the two input terminals of the operational amplifier OPc (e.g., an inverting input terminal).

The average value detection circuit AMON2 detects an average value of the TIA output signal Vtiaout. The average value detection circuit AMON2 outputs a signal indicating the detection result of the average value to the other of the two input terminals of the operational amplifier OPc (e.g., non-inverting input terminal). As described above, the second gain control circuit AGC2 can be modified to another configuration where the inverting input terminal and the non-inverting input terminal of the differential input of the operational amplifier OPc are exchanged to each other and an inverting function is added to the control voltage generating circuit GEN1A.

Based at least in part on the signal output from the peak detection circuit PMON2 (signal indicating the peak value) and the signal output from the average value detection circuit AMON2 (signal indicating the average value), the operational amplifier OPc outputs an output signal Sopc indicating the amplitude of the TIA output signal Vtiaout to the control voltage generating circuit GEN1. More specifically, subtracting an average value of a signal from a peak value of the signal gives a crest value (half value of peak-to-peak amplitude). Since the crest value is a half of the amplitude, the amplitude of the signal can be obtained by the crest value.

For example, when the AC component of the current signal Ipd is not bypassed through the FET Tagc and the gain Avga of the variable gain amplifier circuit VGA is not decreased, the output signal Sopc has a voltage corresponding to the magnitude of the current signal Ipd output from the anode of the photodiode PD. For example, when the amplitude of the AC component of the current signal Ipd increases, the voltage of the output signal Sopc increases. In a case that the bypassed amount of the AC component through the FET Tagc and the gain Avga of the variable gain amplifier circuit VGA are maintained at respective constant values, the output signal Sopc varies in accordance with the magnitude of the current signal Ipd output from the anode of the photodiode PD.

The control voltage generating circuit GEN1A of the second gain control circuit AGC2 receives the output signal Sopc, and outputs the gain control voltage Vagc2 to the gate of the FET Tagc. The gain control voltage Vagc2 output from the second gain control circuit AGC2, for example, is output from the drain of the FET Td3 of the control voltage generating circuit GEN1A in the second gain control circuit AGC2 (see FIG. 4). As shown in FIG. 4, the control voltage generating circuit GEN1A may have the same circuit configuration as the control voltage generating circuit GEN1. Incidentally, the control voltage generating circuit GEN1A may have a circuit configuration that differs from the control voltage generating circuit GEN1.

Each of the gain control voltage Vagc1 shown in FIG. 1 and the gain control voltage Vagc2 shown in FIG. 6 is a signal for controlling the bypassed amount of the AC component described above, and switches on and off the FET Tagc. When the FET Tagc is on (in a ON state), the AC component (AC current) of the current signal Ipd is partially bypassed through a resistance (on resistance) between the source and the drain of the FET Tagc.

When the FET Tagc is on, a portion of the AC component of the current signal Ipd flows through the FET Tagc into the second amplifier circuit AM2 and the rest of the AC component of the current signal Ipd is input to the main TIA circuit. Therefore, the input current Iin (AC current) input to the first amplifier circuit AM1 is reduced by the bypassed amount through the FET Tagc than the current signal Ipd. Here, the input current Iin and the bypassed current through the FET Tagc are both signal components (AC components) of the current signal Ipd. At this time, the drain (first current terminal) of the FET Tagc preferably has a potential equal to a potential of the source (second current terminal) of the FET Tagc to prevent a DC component of the current signal Ipd from flowing into the FET Tagc.

When the FET Tagc is off (in a OFF state), the current signal Ipd hardly flows from the drain to the source of the FET Tagc. Therefore, when the FET Tagc is off, the whole of the AC component of the current signal Ipd is input to the main TIA circuit as the input current Iin. That is, the incoming current Iin is approximately equal to the current signal Ipd when bypassing by the FET Tagc is not performed. Incidentally, when the FET Tagc is off, in order to prevent the current signal Ipd from flowing into the FET Tagc, output impedance of the FET Tagc as viewed from the input terminal IN is set to be larger than input impedance of the main TIA circuit. For example, the output impedance of the FET Tagc in the OFF state is set to 100 times or more of the input impedance of the main TIA circuit.

Figure 8:
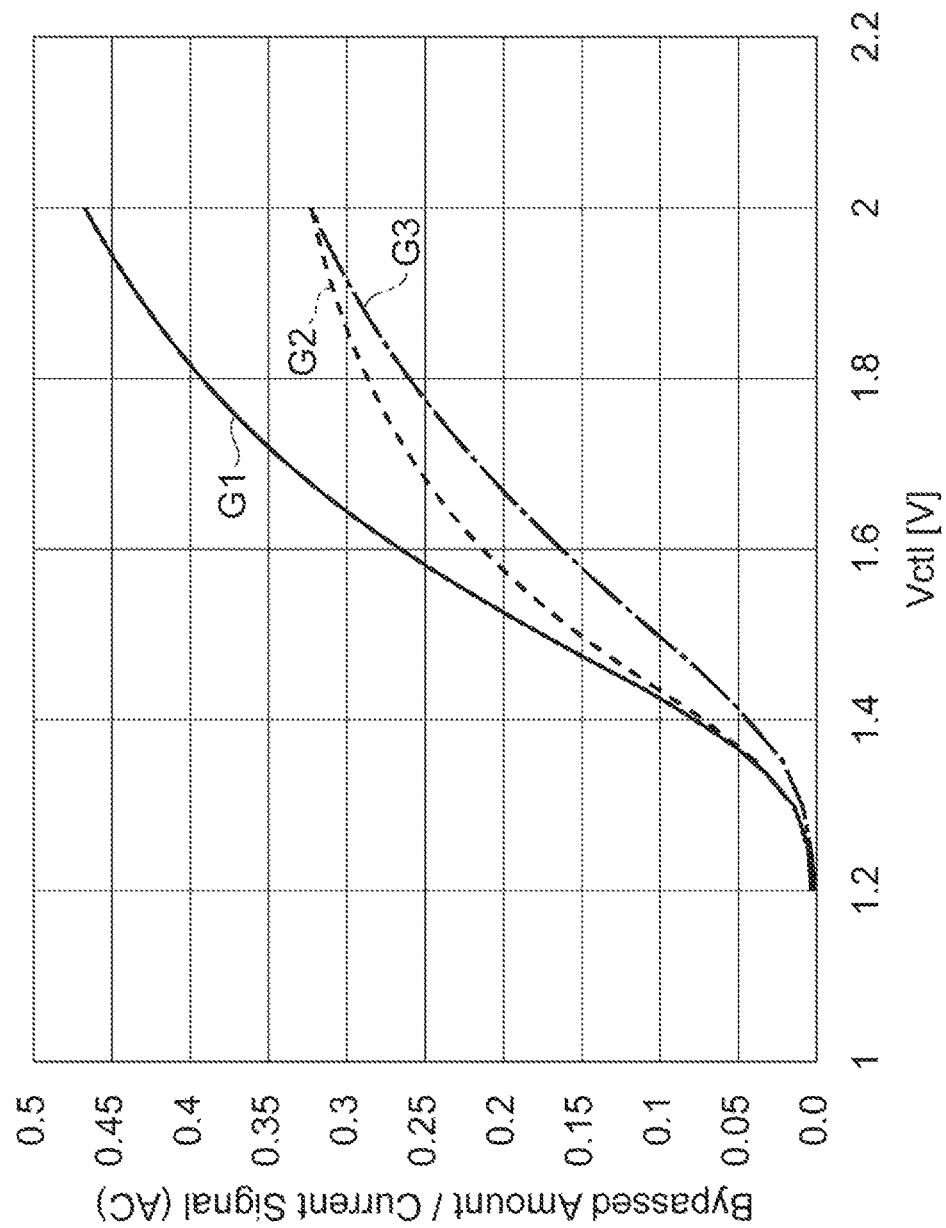
FIG. 8 is a diagram for explaining an effect of the transimpedance amplifier circuit shown in each of FIG. 1 and FIG. 6.

Referring to FIG. 8, an effect achieved by the TIA circuit 1 including the main TIA circuit, where the first amplifier circuit AM1 has the configuration shown in FIG. 5 and the input and the output of the first amplifier circuit AM1 are electrically connected through the resistor RF1, is described. In FIG. 8, the horizontal axis represents the voltage value [V] of Vct1. Vct1 [V] represents voltage values of the gain control voltage Vagc1 shown in FIG. 1 and the gain control voltage Vagc2 shown in FIG. 6.

In FIG. 8, the vertical axis represents a ratio (bypassing ratio) between an amount of the AC component bypassed through the FET Tagc to the second amplifier circuit AM2 in a numerator and the magnitude of the current signal Ipd in a denominator. That is, it shows the ratio of the AC component bypassed by the FET Tagc to the AC component of the current signal Ipd. The AC component of the current signal Ipd in the denominator includes the bypassed amount and the rest of the AC component.

The curves G1, G3 represent results obtained by the configurations of the TIA circuit 1 shown in FIG. 1 and the TIA circuit 1A shown in FIG. 6, where the source of the FET Tagc is connected to the output of the dummy TIA circuit. The curve G2 represents a result obtained by a configuration (comparative example) in which the source of the FET Tagc is connected to the input of the dummy TIA circuit. Here, in any configuration, the output of the second amplifier circuit AM2 is connected to the input of the second amplifier circuit AM2 through the resistor RF2. That is, the second amplifier circuit AM2 and the resistor element RF2 constitute a dummy TIA circuit. The circuit element of the second amplifier circuit AM2 has the same electric properties as the circuit element of the first amplifier circuit AM1. For example, the resistor Rc1 of the second amplifier circuit AM2 has a resistance value equal to a resistance value of the resistor Rc1 of the first amplifier circuit AM1. For example, the transistor Tc1 of the second amplifier circuit AM2 has the same emitter area as the emitter area of the transistor Tc1 of the first amplifier circuit AM1.

The curve G1 represents a result by setting the gate-width of the FET Tagc to 16 [μm] in the exemplary embodiment of the present application. The curve G2, in a comparative example, represents a result obtained by setting the gate width of the field-effect transistor Tagc to 16 [μm]. The curve G3 represents a result of setting the gate-width of the FET Tagc to 8.5 [μm] in the exemplary embodiment of the present application.

Referring to the curve G1 and the curve G2 of FIG. 8, the AC current bypassed from the current signal Ipd (bypassed amount) in the exemplary embodiment of the present invention (TIA circuit 1) goes over the bypassed amount in the comparative example (the source of the FET Tagc is connected to the input of the second amplifier circuit AM2 configuration). For example, when Vagc1=2V or Vagc2=2V, the FET Tagc connected to the output of the dummy TIA circuit increases the bypass amount by about 45% in comparison with the FET Tagc connected to the input of the dummy TIA circuit.

Referring to the curve G2 and the curve G3 of FIG. 8, the bypassed amount of the AC component of the current signal Ipd (bypassed amount) of the curve G3 is comparable to that of the curve G2. The curve G2 represents a comparative configuration of the TIA circuit 1 where the source of the FET Tagc is connected to the input of the second amplifier circuit AM2 and the gate width of the FET Tagc is set to about 16 [μm]. The curve G3 represents the configuration of the TIA circuit 1 where the source of the FET Tagc is connected to the output of the second amplifier circuit AM and the gate width of the FET Tagc is reduced to about 8.5 [μm] from about 16 [μm]. Therefore, in order to obtain the same bypass amount, the gate width of the FET Tagc may be smaller by connecting the FET Tagc to the output of the dummy TIA circuit (exemplary embodiment of the present invention) instead of the input of the dummy TIA circuit (comparative example). The FET Tagc with a smaller gate width has smaller parasitic capacitances. The reduction of the parasitic capacitance allows the TIA circuit 1 to amplify the current signal Ipd in a wider band. For example, the TIA circuit 1 according to the exemplary embodiment of the present invention can improve the bandwidth compared to the comparative example.

For the TIA circuit 1 of the configuration described above, a dummy TIA circuit having the same configuration as the main TIA circuit that amplifies the current signal Ipd output from the photodiode PD. The FET Tagc electrically connected between the input of the main TIA circuit and the output of the dummy TIA circuit allows the TIA circuit 1 to suitably bypass a portion of the AC component from the current signal Ipd.

The output of the dummy TIA circuit to which the FET Tagc is connected is the output of the emitter follower which has low output impedance. Therefore, even when the FET Tagc is relatively small and the on-resistance is relatively large, the AC component of the current signal Ipd can be preferably bypassed. Since the FET Tagc with a reduced size of the gate width or the like can suitably bypass the AC component of the current signal Ipd, decrease in bandwidth properties due to the parasitic capacitors can be suppressed.

Furthermore, the circuit configuration of the main TIA circuit and the circuit configuration of the dummy TIA circuit are identical to each other. Therefore, the input potential of the main TIA circuit and the output potential of the dummy TIA circuit can be substantially equal without adding other circuits. Therefore, an increase in power consumption by adding the other circuits can be avoided. Furthermore, since the potential of the output of the dummy TIA circuit can be used as the reference potential Vref, no other circuits are required for supplying the reference potential Vref to the differential input of the variable gain amplifier circuit VGA.

Modification 2

Figure 9:
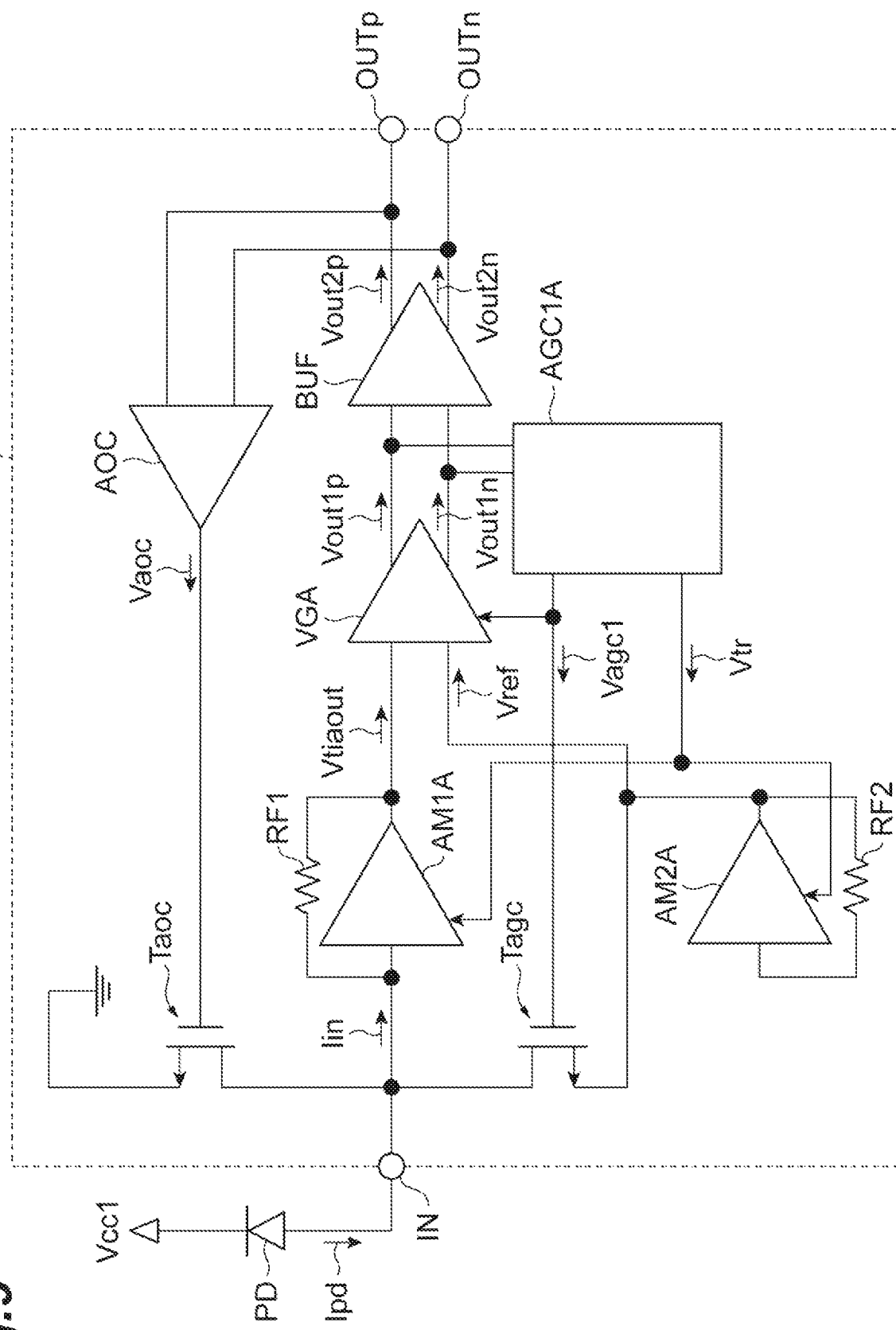
FIG. 9 is a diagram showing another configuration of the transimpedance amplifier circuit according to the exemplary embodiment.

The TIA circuit 1B shown in FIG. 9 has a configuration that the first amplifier circuit AM1, the second amplifier circuit AM2, and the first gain control circuit AGC1 are exchanged for the first amplifier circuit AM1A, the second amplifier circuit AM2A, and the first gain control circuit AGC1A, respectively, from the configuration of the TIA circuit 1 shown in FIG. 1. The first amplifier circuit AM1A, the second amplifier circuit AM2A, and the first gain control circuit AGC1A are described later. Hereinafter, the configuration of the TIA circuit 1B shown in FIG. 9 is described about different parts from the configuration of the TIA circuit 1 shown in FIG. 1.

Figure 12:
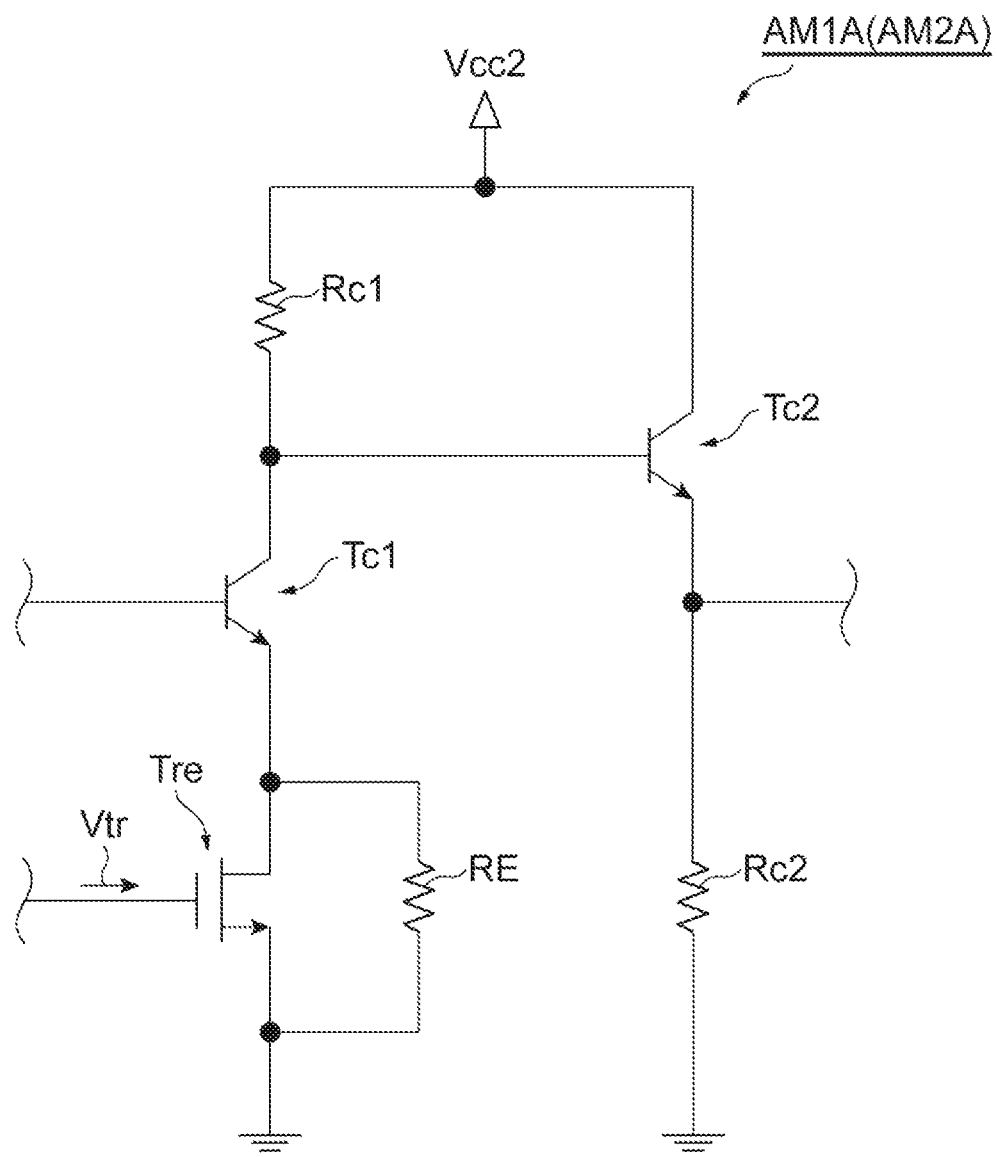
FIG. 12 is a diagram showing an example of a specific configuration of a first amplifier circuit shown in FIG. 9.

The first amplifier AM1 may have the configuration shown in FIG. 12 instead of the configuration shown in FIG. 5. The first amplifier circuit AM1A shown in FIG. 12 includes, for example, a transistor Tc1 and the transistor Tc2, the resistor Rc1 and the resistor Rc2, the resistor RE (gain control resistor), and a FET Tre (gain control transistor). The transistor Tc1, the resistor Rc1, the resistor RE, and the FET Tre constitute an inverting amplifier circuit. The transistor Tc2 and the resistor Rc2 constitute an emitter follower circuit (emitter follower).

The base (control terminal) of the transistor Tc1 is electrically connected to an input of the first amplifier circuit AM1A. The emitter (first current terminal) of the transistor Tc2 is an output of the emitter follower, and is electrically connected to an output of the first amplifier circuit AM1A. The collector (second current terminal) of the transistor Tc1 is an output of an inverting amplifier circuit constituted by the transistor Tc1, the resistor element Rc1, the resistor element RE, and the FET Tre. The base (control terminal) of the transistor Tc2 is an input of the emitter follower constituted by the transistor Tc2 and the resistor Rc2. The collector (second current terminal) of the transistor Tc1 is electrically connected to the base of the transistor Tc2.

The collector of the transistor Tc1 is electrically connected to the power supply Vcc2 through a resistor Rc1. The collector of the transistor Tc2 is electrically connected to the power supply Vcc2. The emitter of the transistor Tc1 is electrically connected to the drain of the FET Tre and the resistor RE.

The source of the FET Tre is grounded. The resistor RE is electrically connected in parallel between the drain and the source of the FET Tre. The gate of the FET Tre receives a gain control voltage Vtr (first gain control voltage) output from the control voltage generating circuit GEN2 to be described later.

The emitter of the transistor Tc2 is grounded through the resistor Rc2. The emitter of the transistor Tc2 is the output of the emitter follower of the first amplifier circuit AM1A and has a relatively low output impedance.

The power supply Vcc2 and a power supply line connected to the power supply Vcc2 provide a power supply voltage VCC2 to the transistor Tc1 and transistor Tc2.

Figure 10:
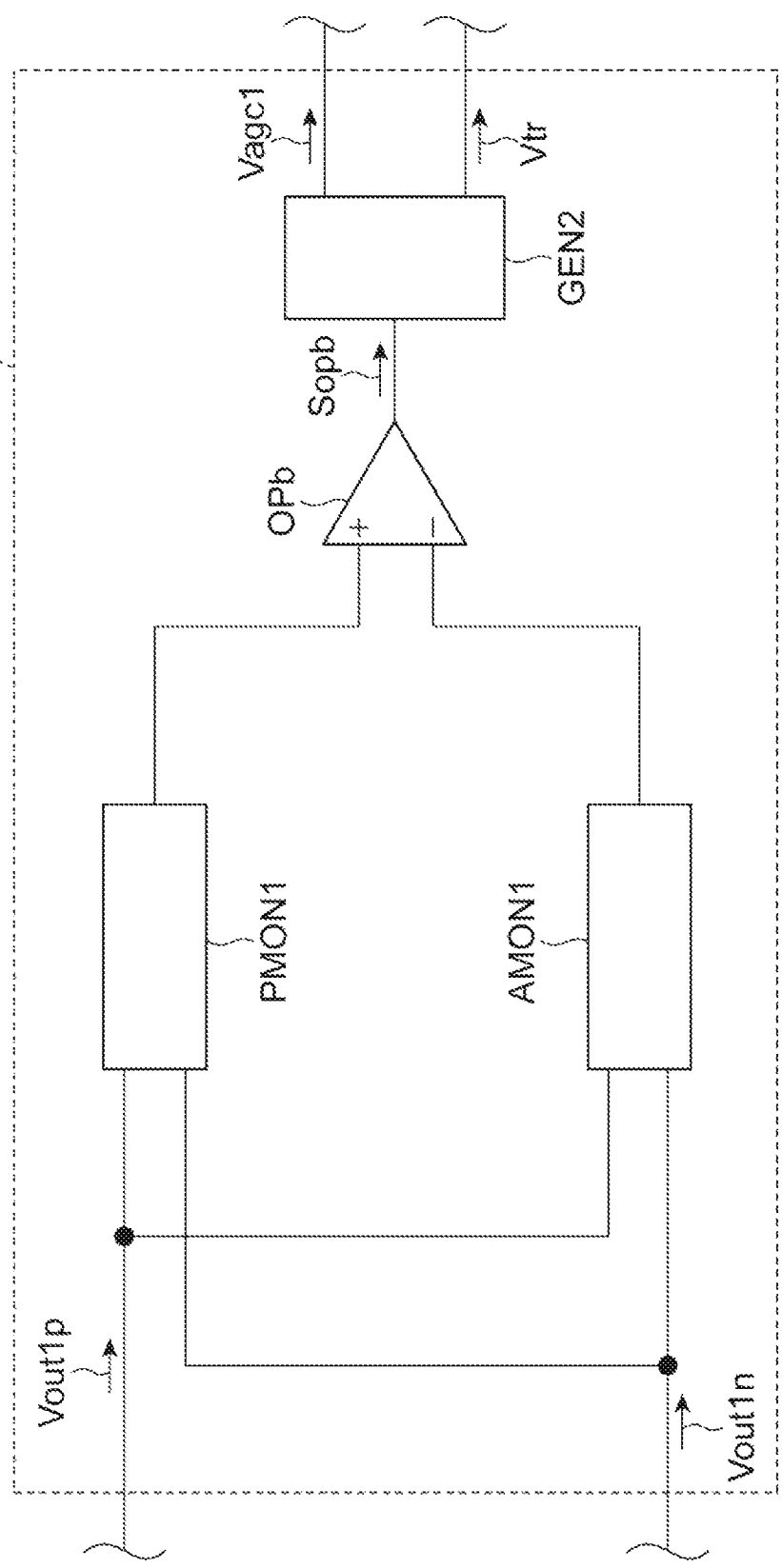
FIG. 10 is a diagram showing an example of a specific configuration of a first gain control circuit shown in FIG. 9.
Figure 11:
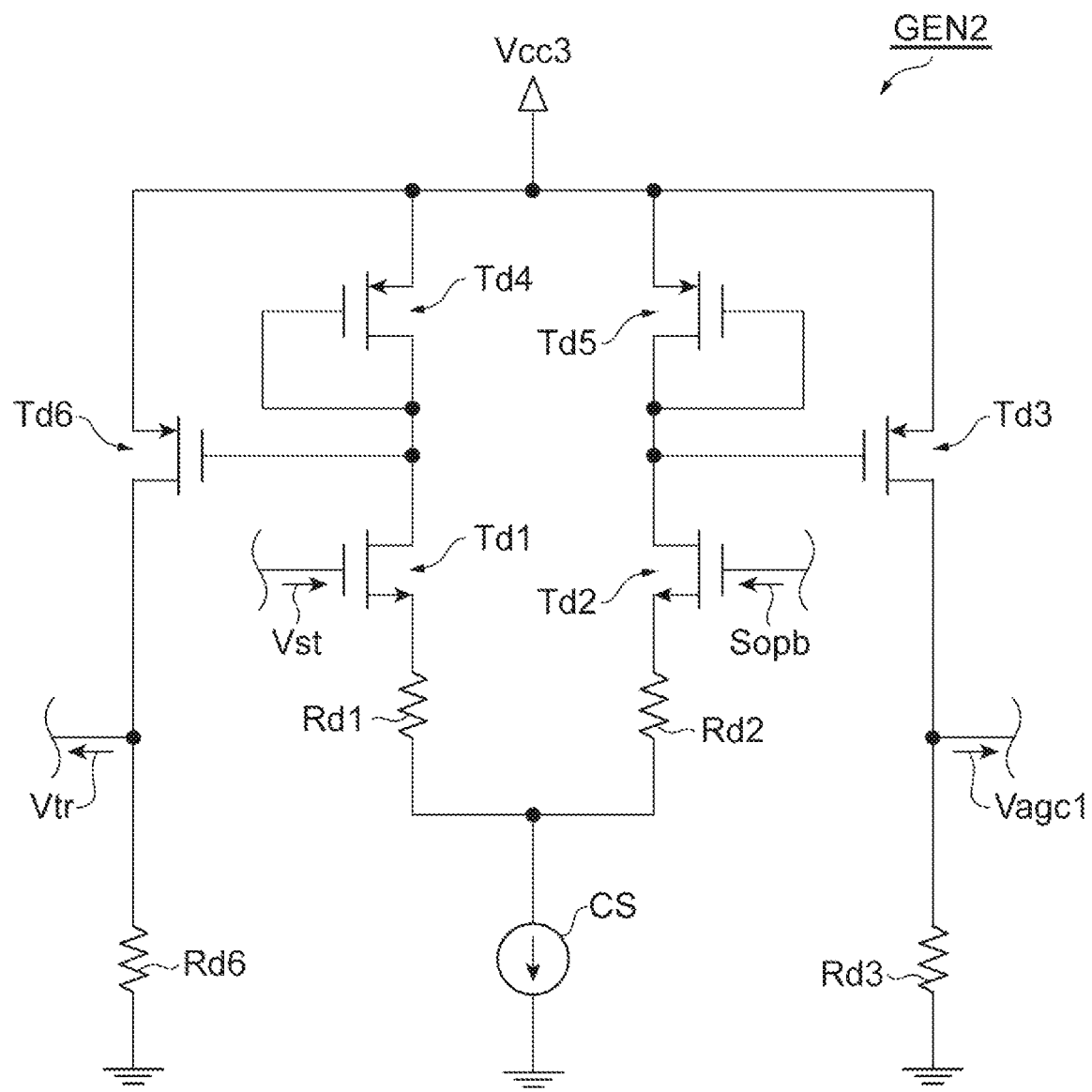
FIG. 11 is a diagram showing an example of a specific configuration of a control voltage generating circuit shown in FIG. 10.

In a case that the first amplifier circuit AM1 has the configuration shown in FIG. 12, the first gain control circuit AGC1 shown in FIG. 3 may adopt a control voltage generating circuit GEN2 shown in FIG. 11 in place of the control voltage generating circuit GEN1 shown in FIG. 4. FIG. 10 shows a first gain control circuit AGC1A including a control voltage generating circuit GEN2 in place of the control voltage generating circuit GEN1.

The control voltage generating circuit GEN2, for example, in addition to the configuration of the control voltage generating circuit GEN1, further includes a FET Td6 (seventh field effect transistor), and a resistor Rd6 (eighth resistor). The gate of the FET Td6 is electrically connected to respective drains of the FET Td1 and the FET Td4.

The source of the FET Td6 is electrically connected to the power supply Vcc3, or to the power supply line connected to the power supply Vcc3.

The drain of the FET Td6 is grounded through a resistor Rd6. The FET Td6 and the resistor Rd6 constitute an inverting circuit in which the gate of the FET Td6 provides an input and the drain of the field effect transistor Td6 provides an output. The drain of the FET Td6 is electrically connected to the FET Tre of the first amplifier circuit AM1A shown in FIG. 12 and a FET of the second amplifier circuit AM2A (the FET corresponding to the FET Tre). Hereinafter, the FET Tre of the first amplifier circuit AM1A and the FET of the second amplifier circuit AM2A (the FET corresponding to the FET Tre) are expressed as the FET Tre, etc.

The control voltage generating circuit GEN2 is used in the first gain control circuit AGC1A shown in FIG. 10, the drain of the FET Td3 is electrically connected to the variable gain amplifier circuit VGA and the gate of the FET Tagc, as well as the control voltage generating circuit GEN1. In this case, the drain of the FET Td3 provides a gain control voltage Vagc1 to the variable gain amplifier circuit VGA and the gate of the FET Tagc.

The drain of the FET Td6 of the control voltage generating circuit GEN2 outputs the gain control voltage Vtr to the FET Tre, etc. shown in FIG. 12. The gain control voltage Vtr is a signal for switching on and off the FET Tre, etc. and adjusting respective on resistances of the FET Tre, etc.

The gain control voltage Vtr varies contrary to the increase or decrease of the gain control voltage Vagc1 (second gain control voltage). For example, when the gain control voltage Vagc1 increases, the gain control voltage Vtr is decreased. Also, the gain control voltage Vtr is increased, when the gain control voltage Vagc1 decreases.

More specifically, when the gain control voltage Vagc1 turns on the FET Tagc (when partially bypassing the AC component from the current signal Ipd), the gain control voltage Vtr turns off the FET transistor Tre, etc. When the FET Tre, etc. are turned off, each of the FET Tre, etc. is not operated and has no current flowing between the drain and the source thereof, so that the emitter current of the transistor Tc1 flows through the resistor RE to ground (ground potential) in the first amplifier circuit AM1A and the second amplifier circuit AM2A. Therefore, by setting resistance value of the resistor RE larger than the on-resistance between the drain and the source of the FET Tre (in the on state), when the FET Tagc bypasses the AC component from the current signal Ipd, input impedance of the main TIA circuit and the dummy TIA circuit is increased and consequently output impedance of the second amplifier circuit AM2A becomes a relatively smaller value. Therefore, the amount of the AC component bypassed from the current signal Ipd to the dummy TIA circuit through the FET Tagc is increased by increasing a ratio between the input impedance value of the main TIA circuit in a numerator and the output impedance value of the dummy TIA circuit in a denominator.

When the gain control voltage Vagc1 turns off the FET Tagc (the AC component is not bypassed from the current signal Ipd), the gain control voltage Vtr turns on the FET Tre, etc. When the FET Tre, etc. are turned on, each of the FET Tre, etc. is operating and allows some current to flow between the drain and source thereof. In this case, the input impedance of the main TIA circuit and the dummy TIA circuit may be a relatively small value. Therefore, adjusting the gain control voltage Vtr allows the input impedance of the main TIA circuit to increase or decrease. For example, by increasing the gain control voltage Vtr, the input impedance of the main TIA circuit becomes relatively small, as the FET Tre is turned on. On the other hand, by decreasing the gain control voltage Vtr, the input impedance of the main TIA circuit becomes relatively large, since the FET Tre is turned off and the resistance value of the resistor RE is set to a larger value than the on-resistance of the FET Tre as described above.

The bypassed amount of the AC component from the current signal Ipd depends on a ratio between the input impedance of the main TIA circuit in a numerator and the input impedance of the FET Tagc viewed from the input side of the main TIA circuit in a denominator. For example, when the impedance of the FET Tagc viewed from the input terminal IN side is smaller than the input impedance of the main TIA circuit, the bypass amount of the AC component is increased. Therefore, when letting the FET Tagc partially bypass the AC component from the current signal Ipd by increasing the gain control voltage Vagc1, the bypass amount can be increased without increasing the gate width of the FET Tagc by decreasing the gain control voltage Vtr and turning off the FET Tre. Thus, in order to obtain the same bypass amount, increasing the input impedance of the main TIA circuit when partially bypassing the AC component allows the gate width of the FET Tagc to be reduced in comparison with a case that the input impedance of the main TIA circuit is fixed. Decreasing the gate width of the FET Tagc reduces the parasitic capacitance of the FET Tagc and allows the TIA circuit 1 to amplify the current signal Ipd in a wider band (up to higher frequency). Bypassing the AC component from the current signal Ipd through the FET Tagc with a smaller gate width advantageously suppresses degradation in bandwidth properties.

Further, the voltage value Vct1 [V] of the gain control voltage Vagc1 and the voltage value Vg [V] of the gain control voltage Vtr, for example, may satisfy a relationship of Vg[V]=2. 2[V]−Vct1 [V]. In this case, for example, when voltage of the output signal Sopb is smaller than the static potential Vst, a combination of Vct1=1.2 [V] and Vg=1.0 [V] is obtained, or when the voltage of the output signal Sopb is greater than the static potential Vst, another combination of Vct1=2.0 [V] and Vg=0.2 [V] is obtained.

Incidentally, in the control voltage generating circuit GEN2 shown in FIG. 11, both the gain control voltage Vtr and the gain control voltage Vagc1 depend on the difference between the potential of the output signal Sopb and the static potential Vst. However, for example, if another differential amplifying circuit with a circuit configuration identical to the circuit configuration of the differential amplifying circuit that the FETs Td1, Td2, Td4, Td5, the resistors Rd1, Rd2, and the current source CS constitute is provided in the control voltage generating circuit GEN2, the output signal Sopb and a static potential Vst' different from the static potential Vst can be input to a differential input (paired inputs) of another differential amplifying circuit to obtain another gain control voltage Vtr. For example, in another differential amplifying circuit, one of the paired inputs receives a static potential Vst' in place of the static potential Vst and the other of the paired inputs receives the output signal Sopb, so that another differential amplifying circuit outputs the gain control voltage Vtr independent of the gain control voltage Vagc1. The original differential amplifying circuit and another differential amplifying circuit can separately vary the gain control voltage Vtr and the gain control voltage Vagc1 in accordance with the output signal Sopb. Thus, the control voltage generating circuit GEN2 separately varies the gain control voltage Vtr and the gain control voltage Vagc1 in accordance with the output signal Sopb.

Figure 13:
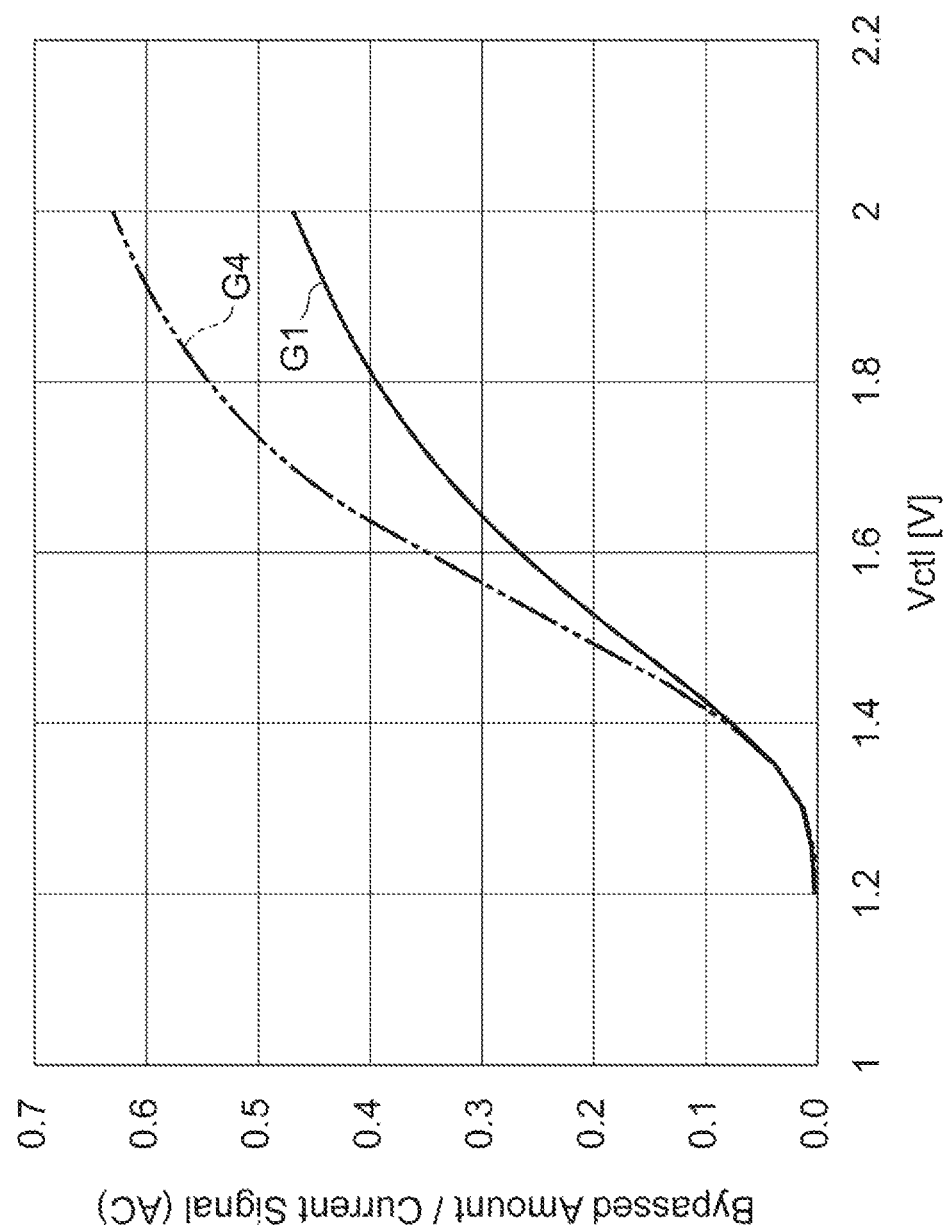
FIG. 13 is a diagram for explaining an effect of the transimpedance amplifier circuit shown in FIG. 9.

Referring to FIG. 13, an effect of the TIA circuit 1B shown in FIG. 9 is described. In FIG. 13, the horizontal axis represents the voltage value [V] of Vct1 and the vertical axis represents a ratio (bypassing ratio) between an amount of the AC component bypassed through the FET Tagc to the second amplifier circuit AM2A in a numerator and the magnitude of the current signal Ipd (photocurrent) prior to bypassing in a denominator. That is, the ratio of the AC component bypassed by the FET Tagc to the AC component of the current signal Ipd is represented. The AC component of the current signal Ipd in the denominator includes the bypassed amount and the rest of the AC component.

The curve G4 is a result obtained by the TIA circuit 1B including the first amplifier circuit AM1A and the second amplifier circuit AM2A having the configuration shown in FIG. 12. The curve G1 is a result obtained by the TIA circuit 1 comprising a first amplifier circuit AM1 and the second amplifier circuit AM2 having the configuration shown in FIG. 5, the same as the curve G1 shown in FIG. 8. Here, each of the circuit elements of the second amplifier circuit AM2A has the same electric properties as the corresponding circuit element of the first amplifier circuit AM1A. For example, the resistor Rc1 of the second amplifier circuit AM2A has a resistance value equal to a resistance value of the resistor Rc1 of the first amplifier circuit AM1A. For example, the transistor Tc1 of the second amplifier circuit AM2A has an emitter area equal to an emitter area of the transistor Tc1 of the first amplifier circuit AM1A.

The first amplifier circuit AM1A (and the second amplifier circuit AM2A) having the configuration shown in FIG. 12 allows the input impedance thereof to be varied in a relatively wide range by adjusting the gain control voltage Vtr. In the first amplifier circuit AM1 and the second amplifier circuit AM2 having the configuration shown in FIG. 5, the input impedance cannot be adjusted.

Referring to the curve G1 and the curve G4, the bypassing ratio of the curve G4 is superior to that of the curve G1. This comes from that the first amplifier circuit AM1A (and the second amplifier circuit AM2A) can increase the input impedance of the main TIA circuit (and the dummy TIA circuit) more than the first amplifier circuit AM1 (and the second amplifier circuit AM2), when the FET Tagc partially bypass the AC component from the current signal Ipd. Accordingly, a larger ratio between the input impedance of the main TIA circuit in a numerator and the input impedance of the FET Tagc viewed from the input side of the main TIA circuit in a denominator brings a larger bypass amount of the AC component from the current signal Ipd. A superior bypassing ratio allows the gate width of the FET Tagc to be reduced more, when a certain bypass amount is necessary. The FET Tagc with a smaller gate width has smaller parasitic capacitances of the FET Tagc, and allows the TIA circuit 1 to amplify the current signal Ipd in a wider band. Since the AC component can be preferably bypassed by using the FET Tagc with a smaller gate length, degradation of the band characteristic due to the bypassing can be suppressed.

While various exemplary embodiments have been described above, various omissions, substitutions, and changes may be made without being limited to the exemplary embodiments described above. It is also possible to combine elements in different embodiments to form other embodiments.

From the foregoing description, it will be appreciated that various embodiments of the present disclosure have been described herein for purposes of description and that various changes may be made without departing from the scope and spirit of the disclosure. Accordingly, the various embodiments disclosed herein are not intended to be limiting, with a true scope and spirit being indicated by the appended claims.

What is claimed is:

1. A transimpedance amplifier (TIA) circuit comprising:
an input terminal configured to receive a current signal from an external photodetector;
a first TIA circuit having a first input and a first output, the first input being configured to receive an input current, the first TIA circuit being configured to convert the input current to a voltage signal, the first output being configured to output the voltage signal, the first input being electrically connected to the input terminal;
a second TIA circuit having a second input and a second output, the second input being left open, the second output being configured to output a reference signal;
a field effect transistor (FET) having a control terminal, a first current terminal, and a second current terminal, the first current terminal being electrically connected to the input terminal, the second current terminal being electrically connected to the second output of the second TIA circuit, the FET being configured to vary a resistance between the first current terminal and the second current terminal in accordance with a control signal applied to the control terminal; and
a gain control circuit configured to detect an amplitude of the voltage signal and generate the control signal according to a detection result of the amplitude,
wherein the second TIA circuit has same circuit configuration as the first TIA circuit.

2. The TIA circuit according to claim 1, wherein
the first TIA circuit includes a first amplifier and a first resistor, the first amplifier receives the input current via the first input and outputs the voltage signal via the first output, and the first output is electrically connected to the first input via the first resistor,
the second TIA circuit includes a second amplifier and a second resistor, the second amplifier is electrically connected to the second input and outputs the reference signal via the second output, and the second output is electrically connected to the second input via the second resistor,
the second amplifier has a same circuit configuration as the first amplifier, and
the second resistor has a resistance identical to a resistance of the first resistor.

3. The TIA circuit according to claim 2, wherein
the first amplifier includes an inverting amplifier and an emitter follower circuit, and
the inverting amplifier includes a first transistor and a third resistor, and outputs the voltage signal to the first output via the emitter follower circuit.

4. The TIA circuit according to claim 1, further comprising a variable gain amplifier, wherein
the variable gain amplifier generates a differential signal based on the voltage signal and the reference signal, and the variable gain amplifier has a variable gain set by a gain control signal.

5. The TIA circuit according to claim 4, further comprising another gain control circuit, wherein
the another gain control circuit is configured to detect an amplitude of the differential signal and to generate the gain control signal according to a detection result for the amplitude of the differential signal for adjusting the variable gain of the variable gain amplifier.

6. A transimpedance amplifier (TIA) circuit comprising:
an input terminal configured to receive a current signal from an external photodetector;
a first TIA circuit having a first input and a first output, the first input being configured to receive an input current, the first TIA circuit being configured to convert the input current to a voltage signal, the first output being configured to output the voltage signal, the first input being electrically connected to the input terminal;
a second TIA circuit having a second input and a second output, the second input being left open, the second output being configured to output a reference signal;

a field effect transistor (FET) having a control terminal, a first current terminal, and a second current terminal, the first current terminal being electrically connected to the input terminal, the second current terminal being electrically connected to the second output of the second TIA circuit, the FET being configured to vary a resistance between the first current terminal and the second current terminal in accordance with a control signal applied to the control terminal;

a variable gain amplifier configured to generate a differential signal based on the voltage signal and the reference signal, the variable gain amplifier having a variable gain set by the control signal; and a gain control circuit configured to detect an amplitude of the differential signal and to generate the control signal according to a detection result of the amplitude, wherein the second TIA circuit has a same circuit configuration as the first TIA circuit.

7. The TIA circuit according to claim 6, wherein the first TIA circuit includes a first amplifier and a first resistor, the first amplifier receives the input current via the first input and outputs the voltage signal via the first output, and the first output is electrically connected to the first input via the first resistor, the second TIA circuit includes a second amplifier and a second resistor, the second amplifier is electrically connected to the second input and outputs the reference signal via the second output, and the second output is electrically connected to the second input via the second resistor, the second amplifier has a same circuit configuration as the first amplifier, and the second resistor has a resistance identical to a resistance of the first resistor.

8. The TIA circuit according to claim 7, wherein the first amplifier includes an inverting amplifier and an emitter follower circuit, and the inverting amplifier includes a first transistor and a third resistor, and outputs the voltage signal to the first output via the emitter follower circuit.

9. The TIA circuit according to claim 6, wherein the gain control circuit is configured to apply a voltage signal to the first TIA circuit and the second TIA circuit for adjusting input impedances of the first TIA circuit and the second TIA circuit.

* * * * *